United States Patent
Liu et al.

(10) Patent No.: US 11,668,849 B2
(45) Date of Patent: Jun. 6, 2023

(54) AUTOMATED WELL TIME ESTIMATION

(71) Applicant: Schlumberger Technology Corporation, Sugar Land, TX (US)

(72) Inventors: Qing Liu, Beijing (CN); Wanning Liu, Beijing (CN); Cheolkyun Jeong, Beijing (CN); Diego Medina, Beijing (CN); Yingfei Hu, Beijing (CN)

(73) Assignee: Schlumberger Technology Corporation, Sugar Land, TX (US)

(*) Notice: Subject to any disclaimer, the term of this patent is extended or adjusted under 35 U.S.C. 154(b) by 385 days.

(21) Appl. No.: 16/361,146

(22) Filed: Mar. 21, 2019

(65) Prior Publication Data

US 2019/0293824 A1    Sep. 26, 2019

Related U.S. Application Data

(60) Provisional application No. 62/646,804, filed on Mar. 22, 2018.

(51) Int. Cl.
| | |
|---|---|
| *G01V 1/50* | (2006.01) |
| *G06F 17/18* | (2006.01) |
| *G01V 1/30* | (2006.01) |
| *G06F 3/0482* | (2013.01) |
| *G06F 30/20* | (2020.01) |

(52) U.S. Cl.
CPC .............. *G01V 1/50* (2013.01); *G01V 1/308* (2013.01); *G06F 3/0482* (2013.01); *G06F 17/18* (2013.01); *G06F 30/20* (2020.01); *G01V 2200/16* (2013.01); *G01V 2210/6161* (2013.01); *G01V 2210/6169* (2013.01); *G01V 2210/74* (2013.01)

(58) Field of Classification Search
CPC .......... G01V 1/50; G01V 1/308; G01V 1/301; G01V 2210/74; G01V 2210/6169; G06F 17/18; G06F 3/0482; G06F 30/20; E21B 44/00
See application file for complete search history.

(56) References Cited

PUBLICATIONS

Liu et al., Closing the Loop Between Reservoir Modeling and Well Placement and Positioning, Apr. 11-13, 2006, 2006 SPE Intelligent Energy Conference and Exhibition, Amsterdam, The Netherlands, 13 pp. (Year: 2006).*
Etnyre, Lee, Statistical Detection of Hydrocarbons from Well Logs, Jul. 6-9, 1982, SPWLA 23rd Annual Logging Symposium, 30 pp. (Year: 1982).*
One Petro Search Results, Apr. 7, 2021, 10 pp. (Year: 2021).*
One Petro Search Results, Apr. 8, 2021, 11 pp. (Year: 2021).*
Codling et al., Probabilistic Well Time Estimation Using Operations Reporting Data, Mar. 5-7, 2013, 2013 SPE Digital Energy Conference and Exhibition, The Woodlands, Texas, 13 pp. (Year: 2013).*

* cited by examiner

*Primary Examiner* — Toan M Le
(74) *Attorney, Agent, or Firm* — Jeffrey D. Frantz

(57) ABSTRACT

A method can include accessing data associated with a well and one or more offset wells; based on at least a portion of the data, generating a set of distributions via parametric estimation, where the distributions are associated with a well-related activity and time; analyzing individual distributions in the set of distributions with respect to at least a portion of the data to pass or fail each of the individual distributions; and, for one or more passed individual distributions, outputting one of the passed individual distributions for the well.

20 Claims, 28 Drawing Sheets

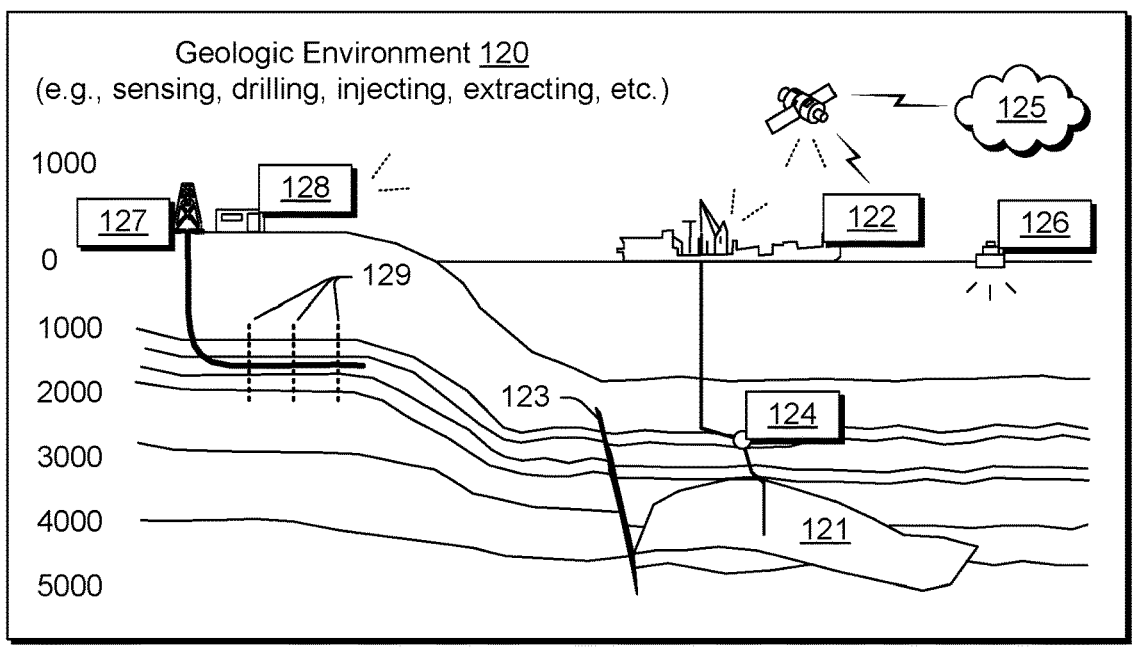
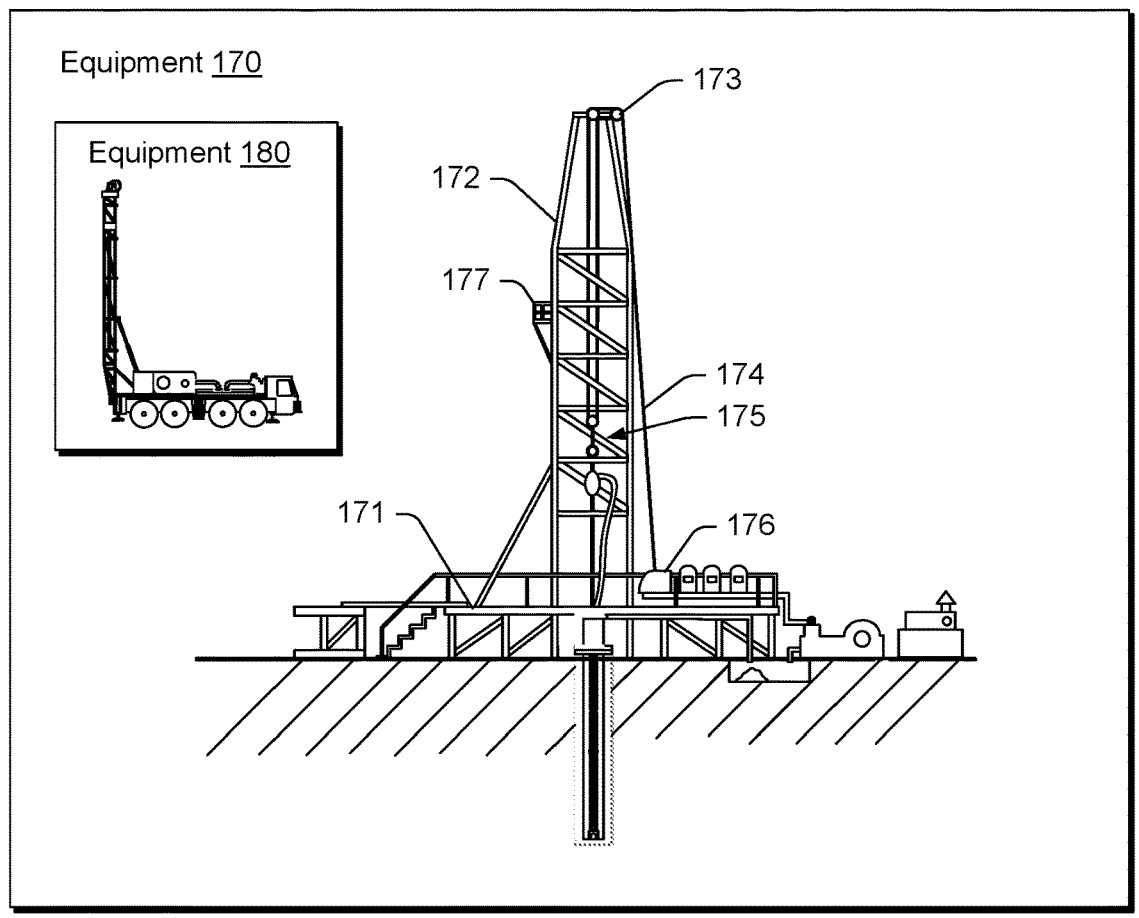
Fig. 1

Method 700
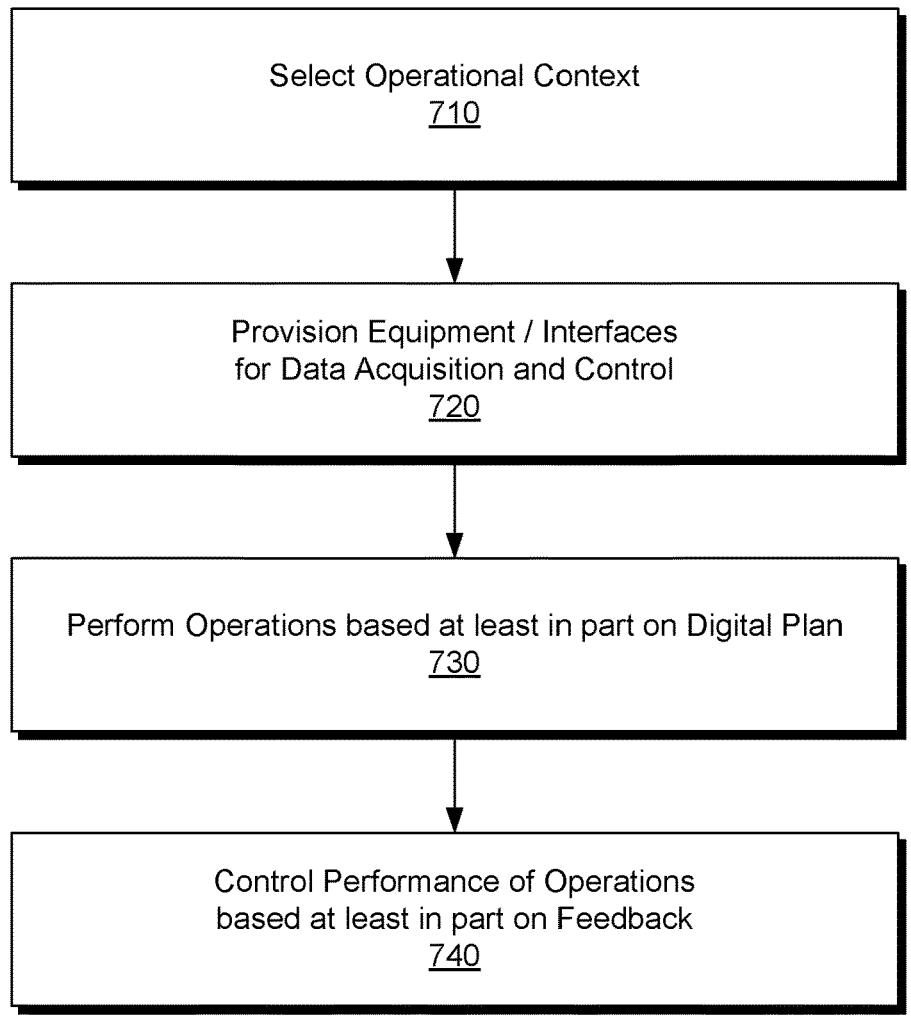
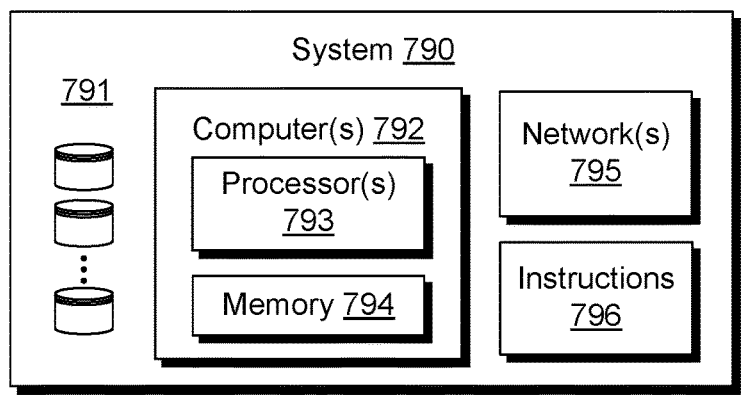
Fig. 7

GUI 1830

| | Clean Pmean (h) | Total Pmean (h) | Cum. Time (d) |
|---|---|---|---|
| ▽ Construct well | | | |
| ▽ Construct section (17.5 in) | | | |
| ▽ Drilling run (30-2030 ft) | | | |
|     Safety meeting | 4.27 | 4.41 | 0.18 |
|     Make up BHA | 7.69 | 7.94 | 0.51 |
|     Trip in to depth (0-30 ft) | 5.29 | 5.46 | 0.74 |
|     Drill to depth (30-2030 ft) | 92.76 | 95.74 | 4.73 |
|     Circulate to condition hole | 5.43 | 5.60 | 4.96 |
|     Pump slug_sweep_pill_spacer | 0.41 | 0.42 | 4.98 |
|     Trip out to depth (2030-0 ft) | 6.38 | 6.58 | 5.26 |
|     Lay down BHA | 5.29 | 5.49 | 5.48 |
| ▽ Drilling run (2030-3030 ft) | | | |
|     Safety meeting | 4.27 | 4.41 | 5.67 |
|     Make up BHA | 7.69 | 7.94 | 6.00 |
|     Trip into depth (0-1030 ft) | 5.29 | 5.46 | 6.23 |
|     Hole open to depth running in hole (1030-2030 ft) | 1.36 | 1.40 | 6.28 |
|     Drill to depth (2030-3030 ft) | 36.12 | 37.27 | 7.84 |
|     Circulate to condition hole | 5.43 | 5.60 | 8.07 |
|     Pump slug_sweep_pill_spacer | 0.41 | 0.42 | 8.09 |
|     Trip out to depth (3030-0 ft) | 6.38 | 6.58 | 8.36 |
|     Lay down BHA | 5.29 | 5.46 | 8.59 |
| ▽ Run casing | | | |
|     Safety meeting | 4.27 | 4.41 | 8.77 |
|     Rig up to run casing | 3.46 | 3.57 | 8.92 |
|     Make up shoe track (0-20 ft) | 5.02 | 5.18 | 9.14 |
|     Run in casing to depth (20-3030 ft) | 4.36 | 4.50 | 9.33 |
|     Circulate-to condition hole | 2.44 | 2.52 | 9.43 |
|     Rig down after casing run | 1.76 | 1.82 | 9.51 |
| ▽ Cement casing | | | |
|     Safety meeting | 4.27 | 4.41 | 9.69 |
|     Rig up to cement casing | 1.90 | 1.96 | 9.77 |
|     Perform single stage cement fob | 7.33 | 7.56 | 10.09 |
|     Rig down after cementing casing | 1.02 | 1.05 | 10.13 |
| ▽ Surface stack activities | | | |
|     Cut casing surface | 8.63 | 8.91 | 10.50 |

Fig. 18

GUI 2210

SETTINGS

Calculation methods   ◯ Deterministic: Clean Time + NPT
                     ⦿ Probabilistic: ΣClean Time + Risk NPT Simulate   ◯ Group Activities (Drilling ROP, Tripping, Casing Run)
           ⦿ All Activities Output Value   ◯ Pmean (e.g., Pave)
               ⦿ P   [ 60 ]

GUI 2230

SETTINGS

Calculation methods   ⦿ Deterministic: Clean Time + NPT
                     ◯ Probabilistic: ΣClean Time + Risk NPT NPT   [ 5 ]   Percent of Clean Time ☐ Use Template Value

Fig. 22

AUTOMATED WELL TIME ESTIMATION

RELATED APPLICATION

This application claims priority to and the benefit of a U.S. Provisional Application having Ser. No. 62/646,804, filed 22 Mar. 2018, which is incorporated by reference herein.

BACKGROUND

A resource field can be an accumulation, pool or group of pools of one or more resources (e.g., oil, gas, oil and gas) in a subsurface environment. A resource field can include at least one reservoir. A reservoir may be shaped in a manner that can trap hydrocarbons and may be covered by an impermeable or sealing rock. A bore can be drilled into an environment where the bore may be utilized to form a well that can be utilized in producing hydrocarbons from a reservoir.

A rig can be a system of components that can be operated to form a bore in an environment, to transport equipment into and out of a bore in an environment, etc. As an example, a rig can include a system that can be used to drill a bore and to acquire information about an environment, about drilling, etc. A resource field may be an onshore field, an offshore field or an on- and offshore field. A rig can include components for performing operations onshore and/or offshore. A rig may be, for example, vessel-based, offshore platform-based, onshore, etc.

Field planning and/or development can occur over one or more phases, which can include an exploration phase that aims to identify and assess an environment (e.g., a prospect, a play, etc.), which may include drilling of one or more bores (e.g., one or more exploratory wells, etc.).

SUMMARY

A method can include accessing data associated with a well and one or more offset wells; based on at least a portion of the data, generating a set of distributions via parametric estimation, where the distributions are associated with a well-related activity and time; analyzing individual distributions in the set of distributions with respect to at least a portion of the data to pass or fail each of the individual distributions; and, for one or more passed individual distributions, outputting one of the passed individual distributions for the well. A system can include a processor; memory accessible by the processor; processor-executable instructions stored in the memory and executable to instruct the system to: access data associated with a well and one or more offset wells; based on at least a portion of the data, generate a set of distributions via parametric estimation, where the distributions are associated with a well-related activity and time; analyze individual distributions in the set of distributions with respect to at least a portion of the data to pass or fail each of the individual distributions; and for one or more passed individual distributions, output one of the passed individual distributions for the well. One or more computer-readable storage media can include processor-executable instructions to instruct a computing system to: access data associated with a well and one or more offset wells; based on at least a portion of the data, generate a set of distributions via parametric estimation, where the distributions are associated with a well-related activity and time; analyze individual distributions in the set of distributions with respect to at least a portion of the data to pass or fail each of the individual distributions; and for one or more passed individual distributions, output one of the passed individual distributions for the well. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates examples of equipment in a geologic environment;

FIG. 7 illustrates an example of a method and an example of a system;

FIG. 18 illustrates an example of a graphical user interface;

FIG. 22 illustrates examples of graphical user interfaces;

DETAILED DESCRIPTION

Figure 2:
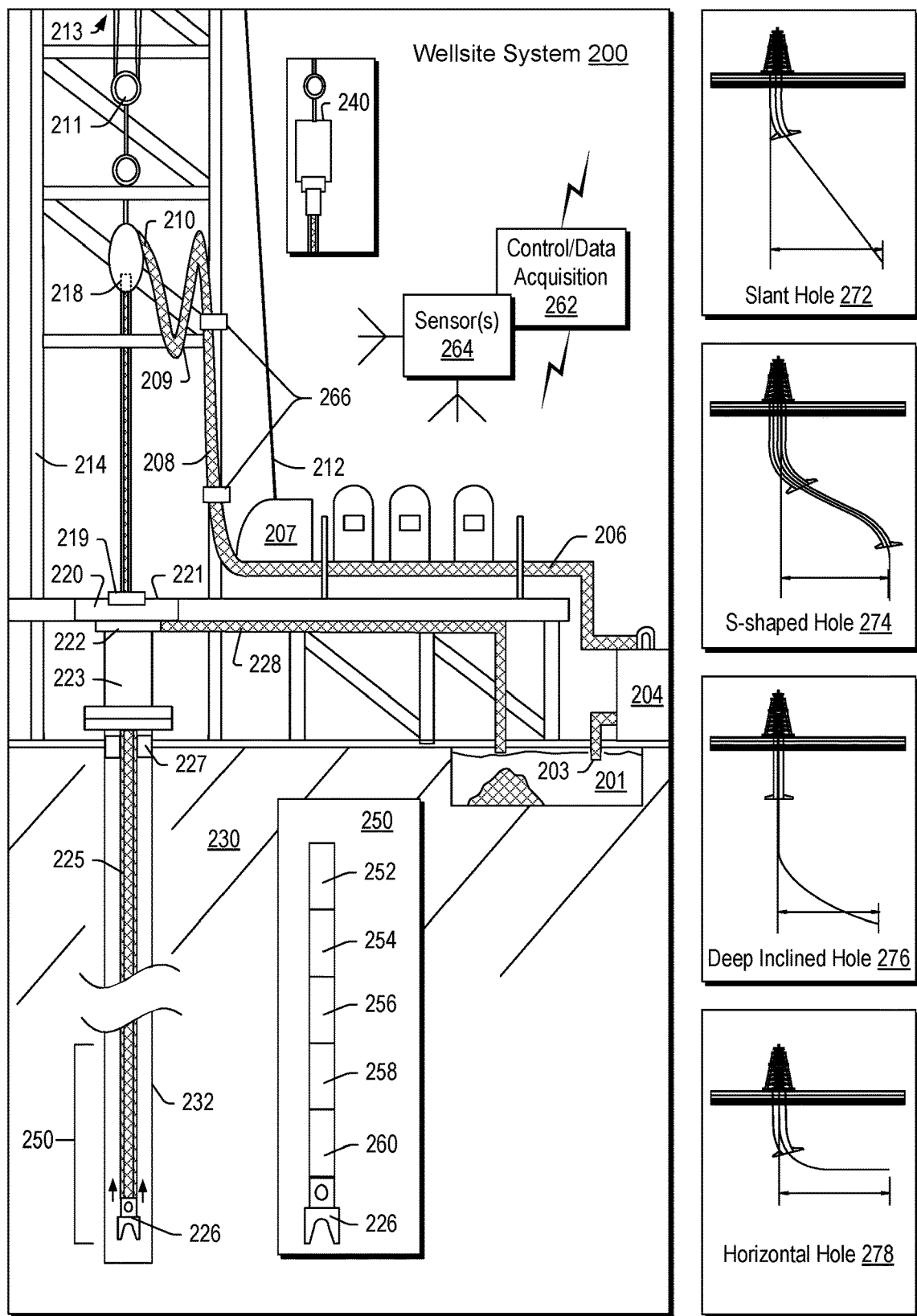
FIG. 2 illustrates examples of equipment and examples of hole types.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, injection, production, etc. As an example, the equipment 127 and/or 128 may provide for measurement, collection, communication, storage, analysis, etc. of data such as, for example, production data (e.g., for one or more produced resources). As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrickman may be a rig crew member that works on a platform attached to a derrick or a mast. A derrick can include a landing on which a derrickman may stand. As an example, such a landing may be about 10 meters or more above a rig floor. In an operation referred to as trip out of the hole (TOH), a derrickman may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrickman controls the machinery rather than physically handling the pipe.

As an example, a trip may refer to the act of pulling equipment from a bore and/or placing equipment in a bore. As an example, equipment may include a drillstring that can be pulled out of a hole and/or placed or replaced in a hole. As an example, a pipe trip may be performed where a drill bit has dulled or has otherwise ceased to drill efficiently and is to be replaced.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drill string 225 may be pulled from a wellbore and optionally replaced, for example, with a new or sharpened drill bit, a smaller diameter drill string, etc. As mentioned, the act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drill string 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measuring-while-drilling (MWD) module 256, an optional module 258, a roto-steerable system and motor 260, and the drill bit 226. Such components or modules may be referred to as tools where a drillstring can include a plurality of tools.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform a method such as geosteering. As an example, a steerable system can include a PDM or a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
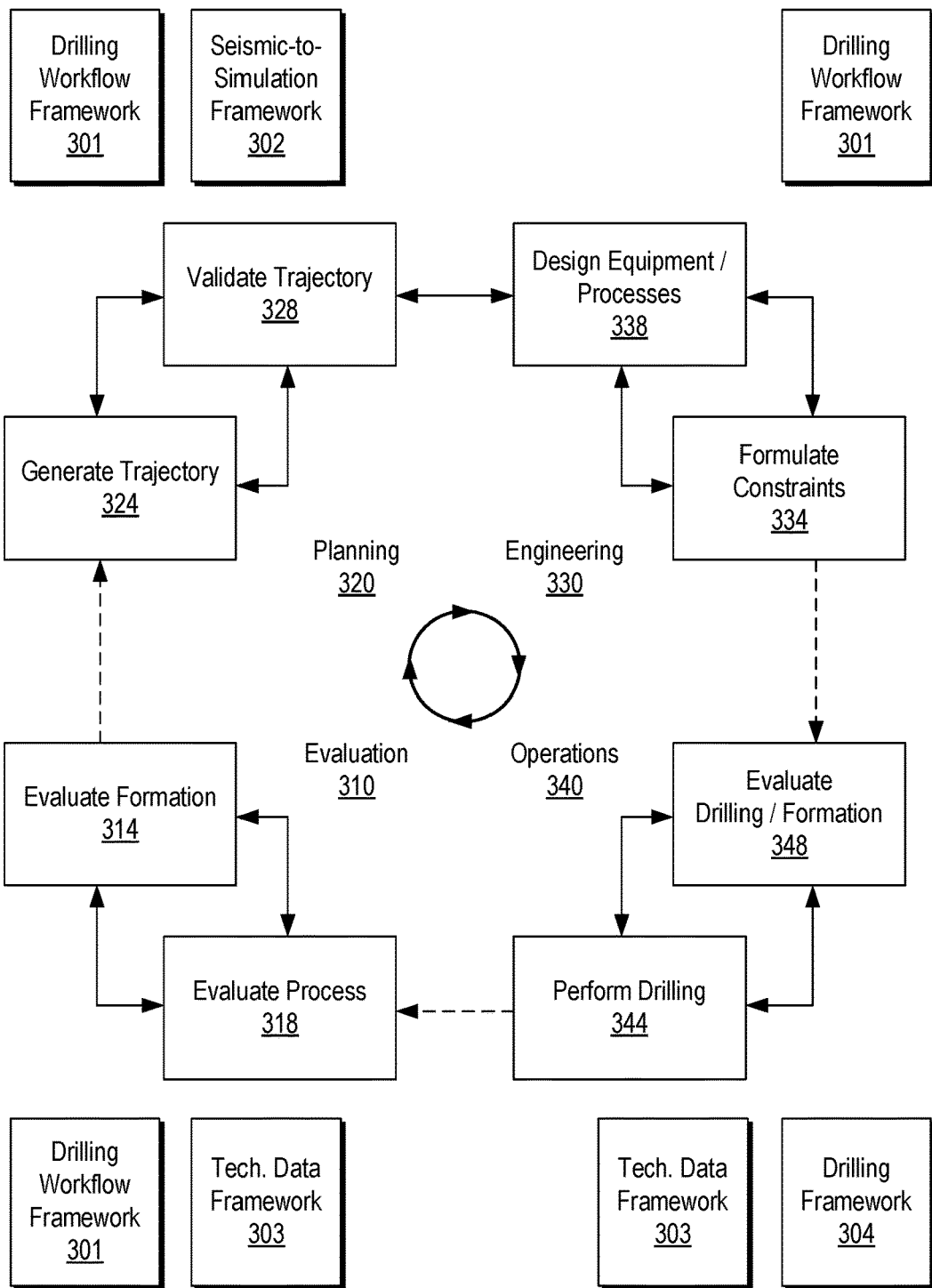
FIG. 3 illustrates an example of a system.

FIG. 3 shows an example of a system 300 that includes various equipment for evaluation 310, planning 320, engineering 330 and operations 340. For example, a drilling workflow framework 301, a seismic-to-simulation framework 302, a technical data framework 303 and a drilling framework 304 may be implemented to perform one or more processes such as a evaluating a formation 314, evaluating a process 318, generating a trajectory 324, validating a trajectory 328, formulating constraints 334, designing equipment and/or processes based at least in part on constraints 338, performing drilling 344 and evaluating drilling and/or formation 348.

In the example of FIG. 3, the seismic-to-simulation framework 302 can be, for example, the PETREL framework (Schlumberger Limited, Houston, Tex.) and the technical data framework 303 can be, for example, the TECHLOG framework (Schlumberger Limited, Houston, Tex.).

As an example, a framework can include entities that may include earth entities, geological objects or other objects such as wells, surfaces, reservoirs, etc. Entities can include virtual representations of actual physical entities that are reconstructed for purposes of one or more of evaluation, planning, engineering, operations, etc.

Entities may include entities based on data acquired via sensing, observation, etc. (e.g., seismic data and/or other information). An entity may be characterized by one or more properties (e.g., a geometrical pillar grid entity of an earth model may be characterized by a porosity property). Such properties may represent one or more measurements (e.g., acquired data), calculations, etc.

A framework may be an object-based framework. In such a framework, entities may include entities based on predefined classes, for example, to facilitate modeling, analysis, simulation, etc. An example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

As an example, a framework can include an analysis component that may allow for interaction with a model or model-based results (e.g., simulation results, etc.). As to simulation, a framework may operatively link to or include a simulator such as the ECLIPSE reservoir simulator (Schlumberger Limited, Houston Tex.), the INTERSECT reservoir simulator (Schlumberger Limited, Houston Tex.), etc.

The aforementioned PETREL framework provides components that allow for optimization of exploration and development operations. The PETREL framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

As an example, one or more frameworks may be interoperative and/or run upon one or another. As an example, consider the framework environment marketed as the OCEAN framework environment (Schlumberger Limited, Houston, Tex.), which allows for integration of add-ons (or plug-ins) into a PETREL framework workflow. The OCEAN framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

As an example, a framework can include a model simulation layer along with a framework services layer, a framework core layer and a modules layer. The framework may include the OCEAN framework where the model simulation layer can include or operatively link to the PETREL model-centric software package that hosts OCEAN framework applications. In an example embodiment, the PETREL software may be considered a data-driven application. The PETREL software can include a framework for model building and visualization. Such a model may include one or more grids.

As an example, the model simulation layer may provide domain objects, act as a data source, provide for rendering and provide for various user interfaces. Rendering may provide a graphical environment in which applications can display their data while the user interfaces may provide a common look and feel for application user interface components.

As an example, domain objects can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

As an example, data may be stored in one or more data sources (or data stores, generally physical data storage devices), which may be at the same or different physical sites and accessible via one or more networks. As an example, a model simulation layer may be configured to model projects. As such, a particular project may be stored where stored project information may include inputs, models, results and cases. Thus, upon completion of a modeling session, a user may store a project. At a later time, the project can be accessed and restored using the model simulation layer, which can recreate instances of the relevant domain objects.

As an example, the system 300 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable at least in part in the PETREL software, for example, that operates on seismic data, seismic attribute(s), etc.

As an example, seismic data can be data acquired via a seismic survey where sources and receivers are positioned in a geologic environment to emit and receive seismic energy where at least a portion of such energy can reflect off subsurface structures. As an example, a seismic data analysis framework or frameworks (e.g., consider the OMEGA framework, marketed by Schlumberger Limited, Houston, Tex.) may be utilized to determine depth, extent, properties, etc. of subsurface structures. As an example, seismic data analysis can include forward modeling and/or inversion, for example, to iteratively build a model of a subsurface region of a geologic environment. As an example, a seismic data analysis framework may be part of or operatively coupled to a seismic-to-simulation framework (e.g., the PETREL framework, etc.).

As an example, a workflow may be a process implementable at least in part in the OCEAN framework. As an example, a workflow may include one or more worksteps that access a module such as a plug-in (e.g., external executable code, etc.).

As an example, a framework may provide for modeling petroleum systems. For example, the modeling framework marketed as the PETROMOD framework (Schlumberger Limited, Houston, Tex.) includes features for input of various types of information (e.g., seismic, well, geological, etc.) to model evolution of a sedimentary basin. The PETROMOD framework provides for petroleum systems modeling via input of various data such as seismic data, well data and other geological data, for example, to model evolution of a sedimentary basin. The PETROMOD framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL framework, workflows may be constructed to provide basin-to-prospect scale exploration solutions. Data exchange between frameworks can facilitate construction of models, analysis of data (e.g., PETROMOD framework data analyzed using PETREL framework capabilities), and coupling of workflows.

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG framework. As an example, the TECHLOG framework can be interoperable with one or more other frameworks such as, for example, the PETREL framework.

As an example, various aspects of a workflow may be completed automatically, may be partially automated, or may be completed manually, as by a human user interfacing with a software application. As an example, a workflow may be cyclic, and may include, as an example, four stages such as, for example, an evaluation stage (see, e.g., the evaluation equipment 310), a planning stage (see, e.g., the planning equipment 320), an engineering stage (see, e.g., the engineering equipment 330) and an execution stage (see, e.g., the operations equipment 340). As an example, a workflow may commence at one or more stages, which may progress to one or more other stages (e.g., in a serial manner, in a parallel manner, in a cyclical manner, etc.).

As an example, a workflow can commence with an evaluation stage, which may include a geological service provider evaluating a formation (see, e.g., the evaluation block 314). As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory (see, e.g., the generation block 324), which may involve execution of one or more G&G software packages. Examples of such software packages include the PETREL framework. As an example, a G&G service provider may determine a well trajectory or a section thereof, based on, for example, one or more model(s) provided by a formation evaluation (e.g., per the evaluation block 314), and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

As an example, a workflow may progress to a first engineering service provider (e.g., one or more processing machines associated therewith), which may validate a well trajectory and, for example, relief well design (see, e.g., the validation block 328). Such a validation process may include evaluating physical properties, calculations, risk tolerances, integration with other aspects of a workflow, etc. As an example, one or more parameters for such determinations may be maintained by a server and/or by the first engineering service provider; noting that one or more model(s), well trajectory(ies), etc. may be maintained by a server and accessed by the first engineering service provider. For example, the first engineering service provider may include one or more computing systems executing one or more software packages. As an example, where the first engineering service provider rejects or otherwise suggests an adjustment to a well trajectory, the well trajectory may be adjusted or a message or other notification sent to the G&G service provider requesting such modification.

As an example, one or more engineering service providers (e.g., first, second, etc.) may provide a casing design, bottom-hole assembly (BHA) design, fluid design, and/or the like, to implement a well trajectory (see, e.g., the design block 338). In some embodiments, a second engineering service provider may perform such design using one of more software applications. Such designs may be stored in one or more databases maintained by one or more servers, which may, for example, employ STUDIO framework tools, and may be accessed by one or more of the other service providers in a workflow.

As an example, a second engineering service provider may seek approval from a third engineering service provider for one or more designs established along with a well trajectory. In such an example, the third engineering service provider may consider various factors as to whether the well engineering plan is acceptable, such as economic variables (e.g., oil production forecasts, costs per barrel, risk, drill time, etc.), and may request authorization for expenditure, such as from the operating company's representative, well-owner's representative, or the like (see, e.g., the formulation block 334). As an example, at least some of the data upon which such determinations are based may be stored in one or more database maintained by one or more servers. As an example, a first, a second, and/or a third engineering service provider may be provided by a single team of engineers or even a single engineer, and thus may or may not be separate entities.

As an example, where economics may be unacceptable or subject to authorization being withheld, an engineering service provider may suggest changes to casing, a bottom-hole assembly, and/or fluid design, or otherwise notify and/or return control to a different engineering service provider, so that adjustments may be made to casing, a bottom-hole assembly, and/or fluid design. Where modifying one or more of such designs is impracticable within well constraints, trajectory, etc., the engineering service provider may suggest an adjustment to the well trajectory and/or a workflow may return to or otherwise notify an initial engineering service provider and/or a G&G service provider such that either or both may modify the well trajectory.

As an example, a workflow can include considering a well trajectory, including an accepted well engineering plan, and a formation evaluation. Such a workflow may then pass control to a drilling service provider, which may implement the well engineering plan, establishing safe and efficient drilling, maintaining well integrity, and reporting progress as well as operating parameters (see, e.g., the blocks 344 and 348). As an example, operating parameters, formation encountered, data collected while drilling (e.g., using logging-while-drilling or measuring-while-drilling technology), may be returned to a geological service provider for evaluation. As an example, the geological service provider may then re-evaluate the well trajectory, or one or more other aspects of the well engineering plan, and may, in some cases, and potentially within predetermined constraints, adjust the well engineering plan according to the real-life drilling parameters (e.g., based on acquired data in the field, etc.).

Whether the well is entirely drilled, or a section thereof is completed, depending on the specific embodiment, a workflow may proceed to a post review (see, e.g., the evaluation block 318). As an example, a post review may include reviewing drilling performance. As an example, a post review may further include reporting the drilling performance (e.g., to one or more relevant engineering, geological, or G&G service providers).

Various activities of a workflow may be performed consecutively and/or may be performed out of order (e.g., based partially on information from templates, nearby wells, etc. to fill in any gaps in information that is to be provided by another service provider). As an example, undertaking one activity may affect the results or basis for another activity, and thus may, either manually or automatically, call for a variation in one or more workflow activities, work products, etc. As an example, a server may allow for storing information on a central database accessible to various service providers where variations may be sought by communication with an appropriate service provider, may be made automatically, or may otherwise appear as suggestions to the relevant service provider. Such an approach may be considered to be a holistic approach to a well workflow, in comparison to a sequential, piecemeal approach.

As an example, various actions of a workflow may be repeated multiple times during drilling of a wellbore. For example, in one or more automated systems, feedback from a drilling service provider may be provided at or near real-time, and the data acquired during drilling may be fed to one or more other service providers, which may adjust its piece of the workflow accordingly. As there may be dependencies in other areas of the workflow, such adjustments may permeate through the workflow, e.g., in an automated fashion. In some embodiments, a cyclic process may additionally or instead proceed after a certain drilling goal is reached, such as the completion of a section of the wellbore, and/or after the drilling of the entire wellbore, or on a per-day, week, month, etc. basis.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

As an example, a system can allow for a reduction in waste, for example, as may be defined according to LEAN. In the context of LEAN, consider one or more of the following types of waste: transport (e.g., moving items unnecessarily, whether physical or data); inventory (e.g., components, whether physical or informational, as work in process, and finished product not being processed); motion (e.g., people or equipment moving or walking unnecessarily to perform desired processing); waiting (e.g., waiting for information, interruptions of production during shift change, etc.); overproduction (e.g., production of material, information, equipment, etc. ahead of demand); over Processing (e.g., resulting from poor tool or product design creating activity); and defects (e.g., effort involved in inspecting for and fixing defects whether in a plan, data, equipment, etc.). As an example, a system that allows for actions (e.g., methods, workflows, etc.) to be performed in a collaborative manner can help to reduce one or more types of waste.

As an example, a system can be utilized to implement a method for facilitating distributed well engineering, planning, and/or drilling system design across multiple computation devices where collaboration can occur among various different users (e.g., some being local, some being remote, some being mobile, etc.). In such a system, the various users via appropriate devices may be operatively coupled via one or more networks (e.g., local and/or wide area networks, public and/or private networks, land-based, marine-based and/or areal networks, etc.).

As an example, a system may allow well engineering, planning, and/or drilling system design to take place via a subsystems approach where a wellsite system is composed of various subsystem, which can include equipment subsystems and/or operational subsystems (e.g., control subsystems, etc.). As an example, computations may be performed using various computational platforms/devices that are operatively coupled via communication links (e.g., network links, etc.). As an example, one or more links may be operatively coupled to a common database (e.g., a server site, etc.). As an example, a particular server or servers may manage receipt of notifications from one or more devices and/or issuance of notifications to one or more devices. As an example, a system may be implemented for a project where the system can output a well plan, for example, as a digital well plan, a paper well plan, a digital and paper well plan, etc. Such a well plan can be a complete well engineering plan or design for the particular project.

Figure 4:
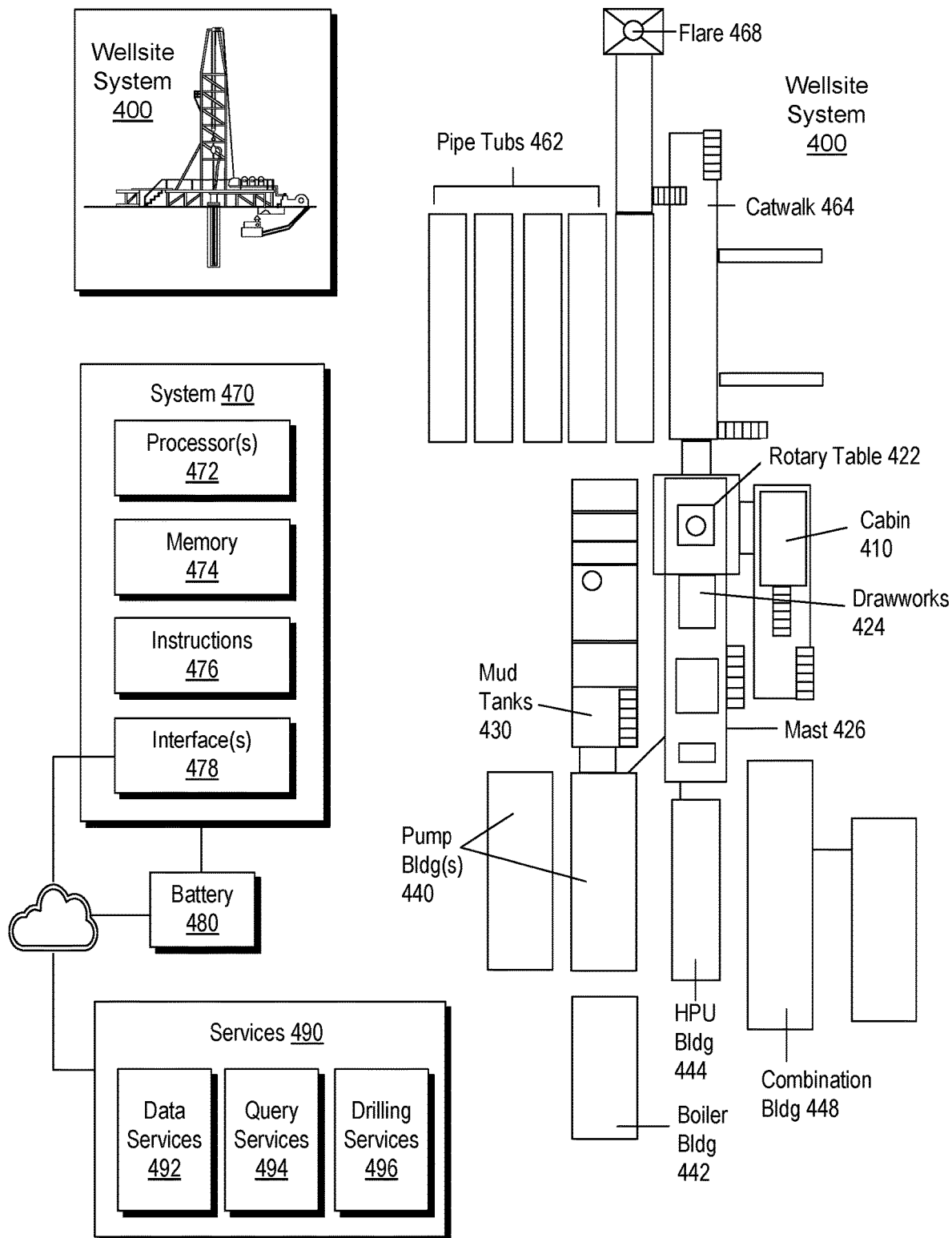
FIG. 4 illustrates an example of a wellsite system and an example of a computing system.

FIG. 4 shows an example of a wellsite system 400, specifically, FIG. 4 shows the wellsite system 400 in an approximate side view and an approximate plan view along with a block diagram of a system 470.

In the example of FIG. 4, the wellsite system 400 can include a cabin 410, a rotary table 422, drawworks 424, a mast 426 (e.g., optionally carrying a top drive, etc.), mud tanks 430 (e.g., with one or more pumps, one or more shakers, etc.), one or more pump buildings 440, a boiler building 442, an HPU building 444 (e.g., with a rig fuel tank, etc.), a combination building 448 (e.g., with one or more generators, etc.), pipe tubs 462, a catwalk 464, a flare 468, etc. Such equipment can include one or more associated functions and/or one or more associated operational risks, which may be risks as to time, resources, and/or humans.

As shown in the example of FIG. 4, the wellsite system 400 can include a system 470 that includes one or more processors 472, memory 474 operatively coupled to at least one of the one or more processors 472, instructions 476 that can be, for example, stored in the memory 474, and one or more interfaces 478. As an example, the system 470 can include one or more processor-readable media that include processor-executable instructions executable by at least one of the one or more processors 472 to cause the system 470 to control one or more aspects of the wellsite system 400. In such an example, the memory 474 can be or include the one or more processor-readable media where the processor-executable instructions can be or include instructions. As an example, a processor-readable medium can be a computer-readable storage medium that is not a signal and that is not a carrier wave.

FIG. 4 also shows a battery 480 that may be operatively coupled to the system 470, for example, to power the system 470. As an example, the battery 480 may be a back-up battery that operates when another power supply is unavailable for powering the system 470. As an example, the battery 480 may be operatively coupled to a network, which may be a cloud network. As an example, the battery 480 can include smart battery circuitry and may be operatively coupled to one or more pieces of equipment via a SMBus or other type of bus.

In the example of FIG. 4, services 490 are shown as being available, for example, via a cloud platform. Such services can include data services 492, query services 494 and drilling services 496. As an example, the services 490 may be part of a system such as the system 300 of FIG. 3.

Figure 5:
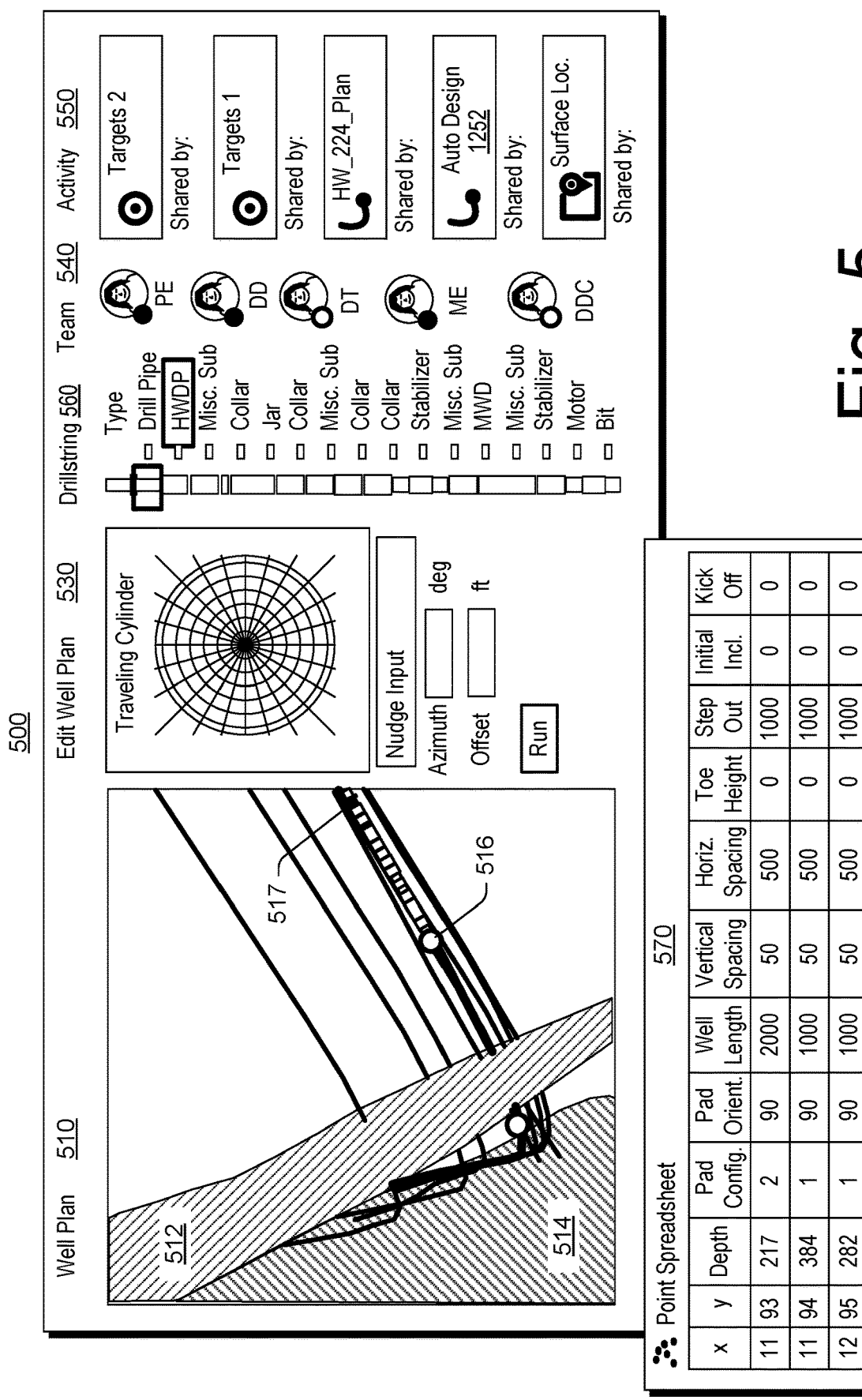
FIG. 5 illustrates an example of a graphical user interface.

FIG. 5 shows an example of a graphical user interface (GUI) 500 that includes information associated with a well plan. Specifically, the GUI 500 includes a panel 510 where surfaces representations 512 and 514 are rendered along with well trajectories where a location 516 can represent a position of a drillstring 517 along a well trajectory. The GUI 500 may include one or more editing features such as an edit well plan set of features 530. The GUI 500 may include information as to individuals of a team 540 that are involved, have been involved and/or are to be involved with one or more operations. The GUI 500 may include information as to one or more activities 550. As shown in the example of FIG. 5, the GUI 500 can include a graphical control of a drillstring 560 where, for example, various portions of the drillstring 560 may be selected to expose one or more associated parameters (e.g., type of equipment, equipment specifications, operational history, etc.). FIG. 5 also shows a table 570 as a point spreadsheet that specifies information for a plurality of wells.

In the example of FIG. 5, the drillstring graphical control 560 includes components such as drill pipe, heavy weight drill pipe (HWDP), subs, collars, jars, stabilizers, motor(s) and a bit. A drillstring can be a combination of drill pipe, a bottom hole assembly (BHA) and one or more other tools, which can include one or more tools that can help a drill bit turn and drill into material (e.g., a formation).

Figure 6:
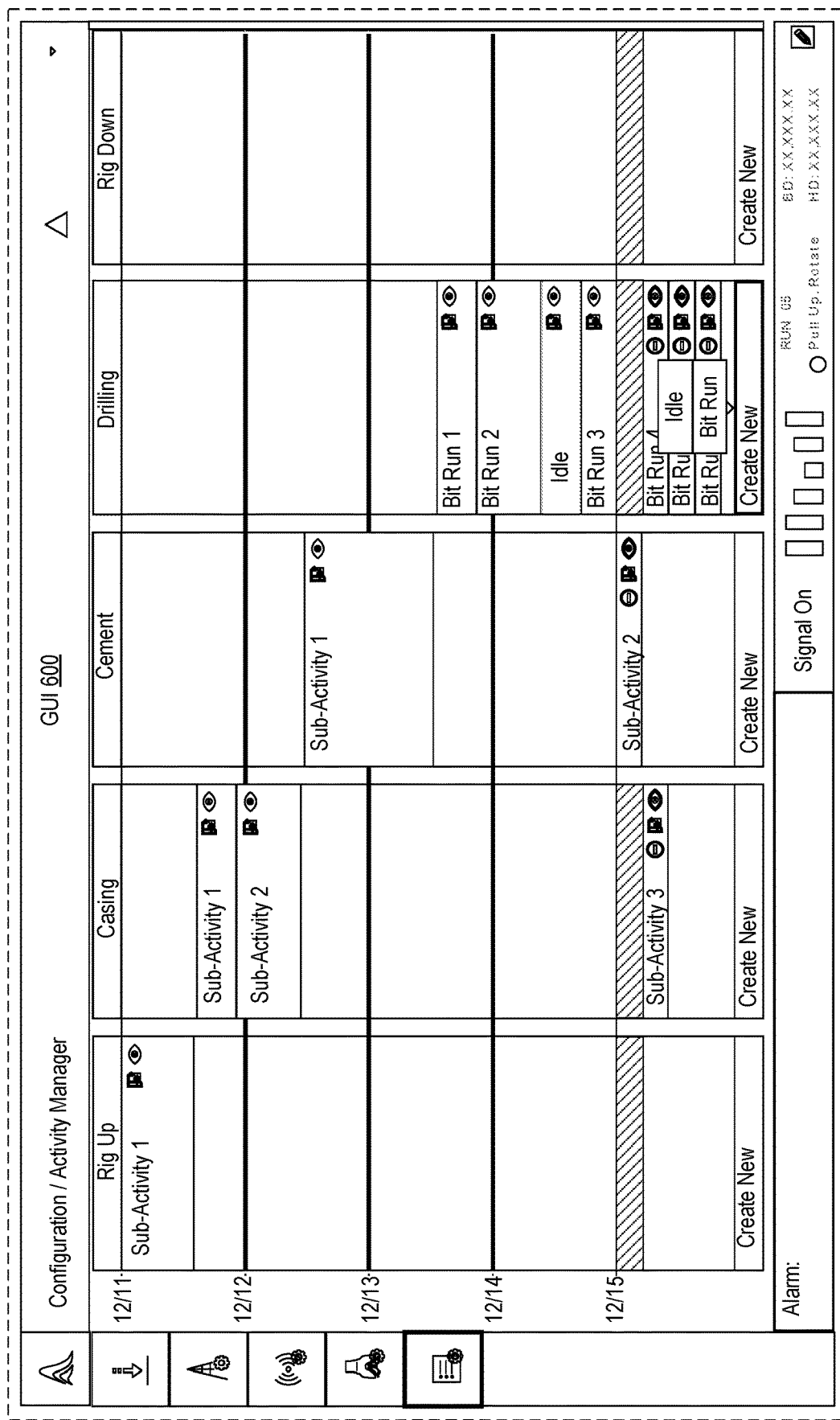
FIG. 6 illustrates an example of a graphical user interface.

FIG. 6 shows an example of a graphical user interface 600 that includes a schedule organized with respect to time (days, dates, etc.) and with respect to various types of operations. The GUI 600 can be part of a well planning system, which may be part of a field development framework. For example, the various operations in the GUI 600 can be implemented to drill at least a portion of a well in a geologic environment (e.g., an oil field or oilfield) where the well may be completed for one or more purposes (e.g., production of hydrocarbons, injection of fluid(s), fracturing of rock, etc.).

As an example, the GUIs 500 and 600 can be part of a field development framework. For example, the well plan 510 of the GUI 500 may be based at least in part on information rendered in the GUI 600. As an example, an interaction with the GUI 500 may be processed by one or more processors to generation information that can be rendered to the GUI 600 and, for example, vice versa.

As an example, a framework may be implemented using computing resources (e.g., hardware, communication equipment, etc.) as may be available, for example, in the cloud, a server, a workstation, etc.

As an example, a framework can include components that can take certain inputs and generate certain outputs. The outputs of a component may be used as inputs of another component or other components such that a real-time workflow can be constructed.

FIG. 7 shows an example of a method 710 and an example of a system 790. The method 710 includes a selection block 710 for selecting an operational context (e.g., well construction, etc.), a provision block 720 for provisioning equipment and/or interfaces for purposes of data acquisition and control, a performance block 730 for performing operations based at least in part on a digital plan, and a control block 740 for controlling performance of operations based at least in part on feedback (e.g., based at least in part on acquired data, etc.).

In the example of FIG. 7, a system 790 includes one or more information storage devices 791, one or more computers 792, one or more networks 795 and instructions 796. As to the one or more computers 792, each computer may include one or more processors (e.g., or processing cores) 793 and memory 794 for storing the instructions 796, for example, executable by at least one of the one or more processors. As an example, a computer may include one or more network interfaces (e.g., wired or wireless), one or more graphics cards, a display interface (e.g., wired or wireless), etc.

Figure 8:
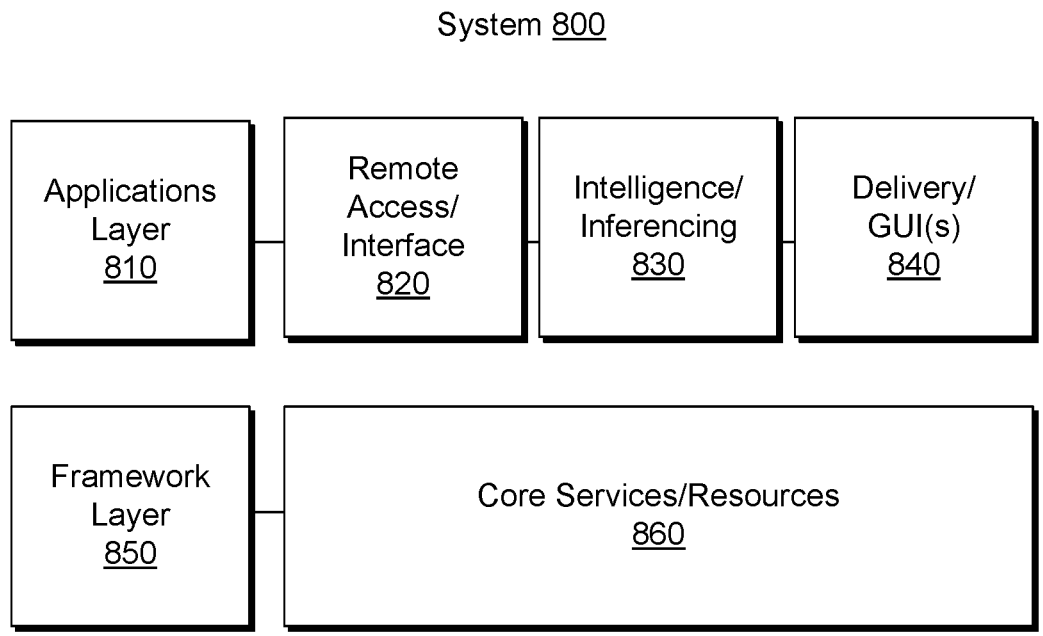
FIG. 8 illustrates an example of a system.

FIG. 8 shows an example of a system 800 that includes various layers and operational blocks, including an applications layer 810 that can include a remote access and interface block 820 (e.g., for access to interfaces of rigsite equipment from one or more remote locations, etc.), an intelligence and inferencing block 830 (e.g., resources optionally remote from a rigsite, etc.), an applications delivery and/or GUIs block 840 (e.g., optionally including one or more application programming interfaces, etc.), and a framework layer 850 that includes a core services and/or resources block 860.

In the example of FIG. 8, the applications layers 810 can include various applications that can be executable using one or more of the framework layer 850 resources. Such applications can include, for example, applications that operate locally, remotely and/or a combination of remotely and locally.

Figure 9:
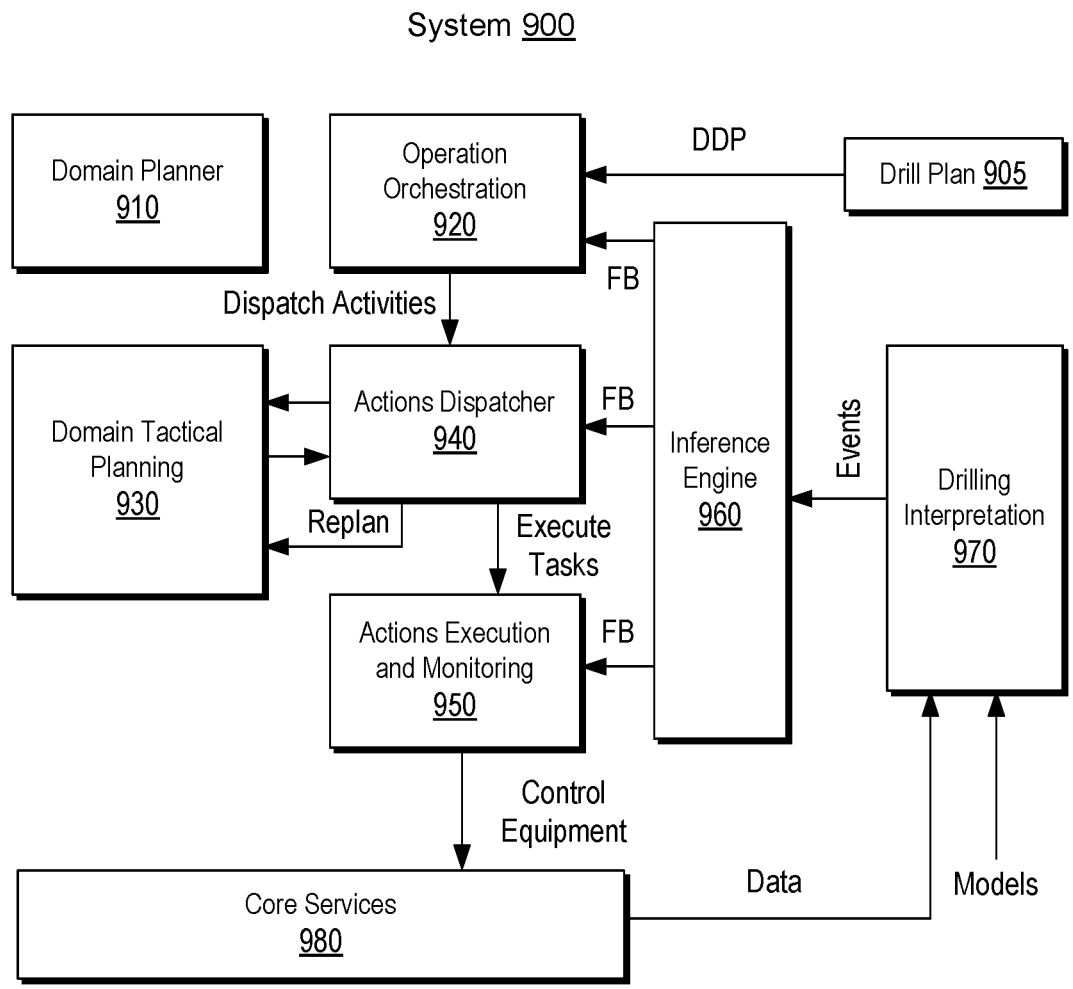
FIG. 9 illustrates an example of a system.

FIG. 9 shows an example of a system 900 that includes various blocks including a digital drill plan (DDP) block 905, a domain planner block 910, an operation orchestration block 920, a domain tactical planning block 930, an actions dispatcher block 940, an actions execution and monitoring block 950, an inference engine block 960, a drilling interpretation block 970, and a core services block 980.

As shown in FIG. 9, various arrows indicate some examples of actions that can be performed utilizing the system 900. In the example of FIG. 9, the inference engine 960 can provide feedback (FB) based at least in part on events as may be provided as output via the drilling interpretation block 970. As shown, the drilling interpretation block 970 can receive data and one or more models (e.g., as to one or more drilling operations, production, injection, materials modeling, fluids modeling, etc.). As shown data may be provided via the core services block 980 (see, e.g., core services 860 of FIG. 8).

The system 900 can include features for dispatching activities, for example, via the operation orchestration block 920, which may dispatch activities response to information (e.g., instructions, etc.) in the drill plan block 905 (e.g., consider executable commands, instructions, etc., as may be specified in a digital drill plan, which may be a digital well plan as explained with respect to FIG. 6 where various activities are illustrated in the GUI 600).

The system 900 can include features for execution of activities, which may be classified as tasks. In such an example, the domain tactical planning block 930 may act to receive activities and to output tasks based on the activities. As an example, the actions dispatcher block 940 can provide logic that requests replanning of tasks and/or activities, which may occur responsive to feedback (FB) as provided via the inference engine block 960. For example, equipment at a rigsite may transmit (e.g., via pull and/or push) data to the core services block 980 where the data are received via the drilling interpretation block 970, which may utilize one or more models to interpret at least a portion of the data based at least in part on one or more of the one or more models. In such an example, one or more events may be output where such one or more events are received by the inference engine block 960, which can infer how such one or more events may impact activities and/or tasks. As the actions dispatcher block 940 is responsible for dispatching, the inference engine block 960 can output feedback as information that may, for example, call of replanning (e.g., via the domain tactical planning block 930). In such an example, real-time operations can be controlled with one or more feedback loops as tasks are executed and data are acquired and received at a rigsite by one or more pieces of equipment.

In the example of FIG. 9, the inference engine block 960 can be cast in a drilling operations context as informed by the drilling interpretation block 970. For example, the drilling interpretation block 970 can inform an inference engine such that inferences are made in the context of drilling operations.

While the foregoing example refers to output of the inference engine block 960 to the actions dispatcher block 940, as shown in FIG. 9, the inference engine block 960 can provide feedback to one or more other blocks. For example, the inference engine block 960 can provide feedback to the operations orchestration block 920 and/or the actions execution and monitoring block 950. In such an example, an informed inference engine can be cast in the context of drilling operations such that inferences, which can be data-based and/or model-based inferences, can affect control of equipment at one or more levels of the system 900. Such an approach provides for multi-level robustness such that data from equipment at one or more rigsites can inform drilling operations, optionally in real-time.

Figure 10:
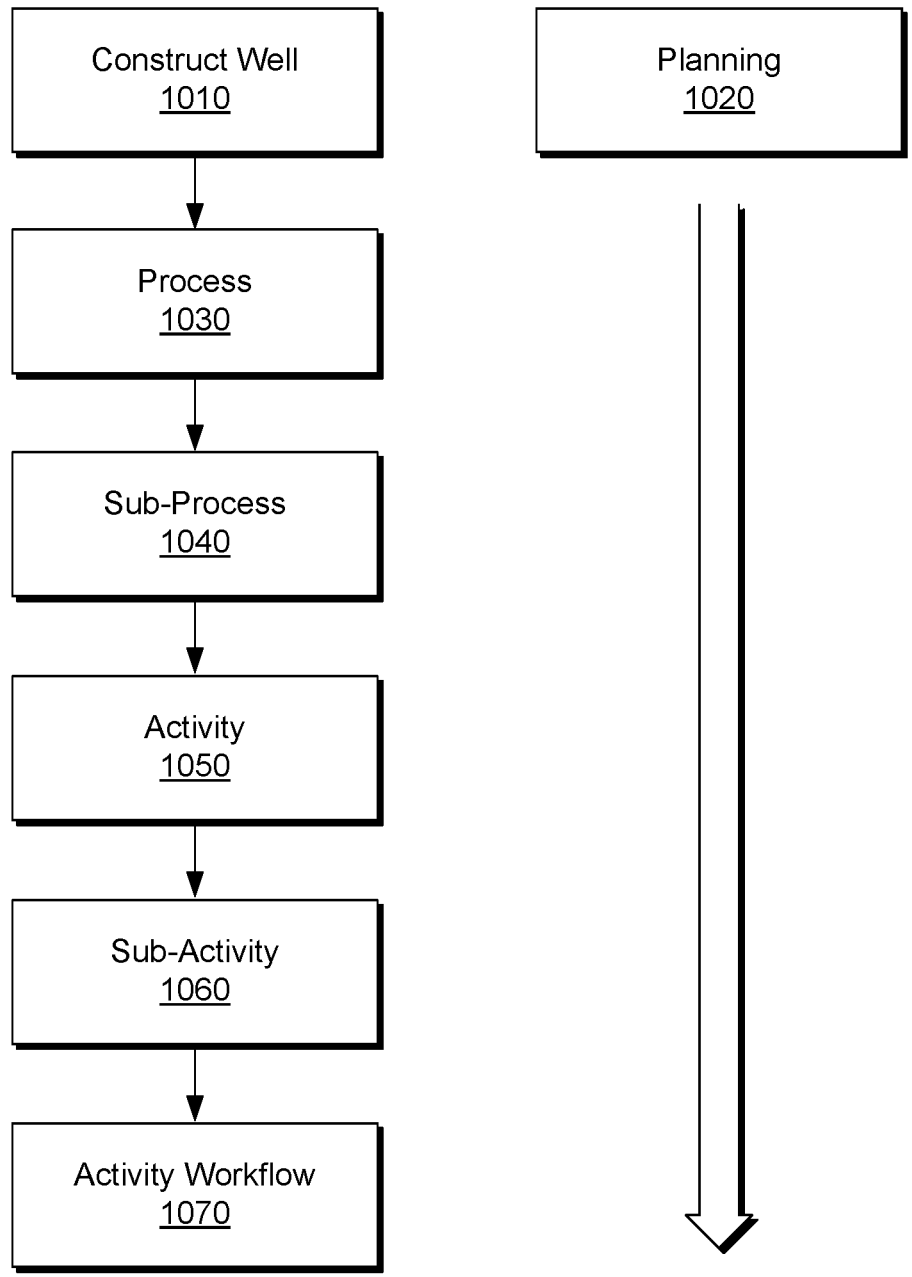
FIG. 10 illustrates an example of a method.

FIG. 10 shows an example of a method 1000 that may implement a system such as, for example, the system 900 of FIG. 9 or the system of 800 of FIG. 8.

In FIG. 10, the method 1000 is in the context of constructing a well, which may be specified, for example, in a digital drill plan or digital well plan (see, e.g., the drill plan block 905 of FIG. 9, the GUI 600 of FIG. 6, etc.).

In the method 1000, a context block 1010 provides the context of constructing a well while a parallel process or processes occur via a planning block 1020, which provides on-going planning (e.g., and/or replanning) during a well construction process per the context block 1010.

As shown, the method 1000 includes a process block 1030, a sub-process block 1040, an activity block 1050, a sub-activity block 1060, and an activity workflow block 1070. Such blocks can be associated with various blocks of the system 900, which, as mentioned, can provide for real-time operations associated with a rigsite, which can include drilling operations.

The method 1000 may be performed, at least in part, in a hierarchal or tiered manner. For example, the method 1000 may include tiers or levels where various planning processes may operate at corresponding tiers or levels, optionally in a cross-sectional manner such that a change at one tier or level can be propagated (e.g., affect) one or more aspects of another tier or level.

During the planning of oil and gas wells, engineers can estimate the time for well construction activities and, for example, non-productive time(s) from non-planned events (e.g., materialized risks). Accurate estimation of well construction activity times helps in determining overall time and cost scope for an oil and gas field development project.

Well construction can include assembling equipment in the field and, for example, operating assembled equipment in the field. Various aspects of well construction can be akin to an assembly line where pieces are assembled and/or deployed to create a system that can be utilized to produce hydrocarbons from a reservoir. As an example, such a system can be an operational "machine" where one or more controllers can be utilized for operational control of one or more subsystems. A system may be assembled in part by humans and in part by machine. As to machine assembly, consider equipment that may utilize robotic technology to make connections between components, to deploy components, etc. Where machines are involved, such machines may operate according to instructions, which can include, for example, instructions output by a controller (e.g., operational control system) that may include memory that stores information in a digital form, such as a digital plan (e.g., a digital well plan, etc.). As an example, well construction can include receiving a digital well plan, storing the digital well plan in memory of a computing system and, based at least in part on the digital well plan, issuing instructions to one or more pieces of equipment that operate to construct a well and/or that operate to make a well system perform one or more functions (e.g., perforating, injecting, drilling, producing, artificial lifting of fluid via an electric submersible pump, artificial lifting of fluid via gas injection, etc.

As an example, a system can include an interface that can receive information and can include an interface that can transmit one or more signals to equipment (e.g., field equipment) such that the equipment performs one or more actions, which may be actions driven by a digital well plan stored in memory of the system. Control of a well construction process can be optimal or sub-optimal. Sub-optimal control can result in non-productive time (NPT) where, for example, equipment is not moving productively, fluid is not flowing productively, etc. Such physical factors can be taken into account by a control system that can operate at least in part based on a digital well plan. Optimal control of a well construction process can help to expedite well construction in a manner that constructs a properly functional and operational well while, for example, accounting for equipment that is involved in the construction of the well (e.g., drilling equipment, etc.). As an example, some equipment utilized to construct a well can be transported to another site for construction of another well. As such, optimal control can take into account more than a single site (e.g., a single well) and may take into account a field that includes a plurality of wells. At the end of a multi-well construction process, multiple wells with associated completions, tubulars, etc., exist in the field, which may, for example, be utilized to produce hydrocarbons from one or more reservoirs.

There are several procedures to model well construction activities timing using deterministic and/or probabilistic approaches, including a "standard operating procedure" (SOP) for well time estimation, which describes a probabilistic modeling for time estimation. The SOP approach can assume that engineers understand the trend of offset wells data to have a reasonable estimate of a probability distribution model to be used for each activity and which statistical parameters can be used as input for modeling. Therefore, the well time estimation process tends to depend on an engineer's personal knowledge and experiences on probability distribution models. It can be challenging to decide which parameters are employed even for some experienced engineers.

As an example, a system can include a component that can automatically select a distribution model (e.g., a probability distribution model). Such a component may be task specific or may accommodate multiple tasks. For example, a system can include one or more components that can automatically select one or more distribution models for particular activities (e.g., tasks in the field, etc.). A system may provide an automated way to select a proper probability distribution model for each activity and, for example, each non-planned event that fits data sampled from one or more offset wells. Such a system may provide automation, for example, via modeling a problem as a fully statistical method. As an example, a system can include one or more features for selecting a deterministic approach or a probabilistic approach. As an example, a selection may be performed automatically or, for example, by user selection via a GUI, etc.

As an example, a system can include one or more components that can provide for parametric estimation and nonparametric estimation, for example, with hypothesis testing as a rule to quantify quality of an employed model and parameters. From a field engineer's position, it may be difficult to evaluate whether a manually selected model is suitable for time estimation or not. In an automated process, if the hypothesis testing passes for one or more standard probability distribution models, the probability distribution model with the highest rank can be automatically selected. In such an example, if the hypothesis testing fails for the standard distribution models considered, a nonparametric estimation approach may be implemented automatically in response to such a failure and recommend, for example, a non-standard probability distribution model. A system may act to evaluate probability distribution models in a more scientifically feasible way than via mere human experience, which can vary from individual to individual.

As an example, a system can model a well time estimation as a probability statistics problem, and provide a "most suitable" probability distribution model using parametric and/or nonparametric estimation methods according to the offset well data. Such an approach may be a multi-well approach for a field that includes a plurality of wells where at least some of the wells have not yet been constructed.

Parametric estimation can refer to a process of using sample data (in reliability engineering, times-to-failure or success data) to estimate the parameters of the selected distribution.

Nonparametric estimation can refer to a statistical method that allows a functional form of a fit to data to be obtained in the absence of guidance or constraints from theory. As a result, procedures of nonparametric estimation can have no "meaningful" associated parameters.

A standard distribution can refer to one or more types of continuous probability distributions, such as, for example, normal, lognormal, gamma, Weibull, Uniform, Triangle, BetaPERT distribution, etc.

As to hypothesis testing, it finds a basis in statistics. For example, hypothesis test can evaluate two mutually exclusive statements about a population to determine which statement is best supported by sample data. Hypothesis testing can be used in determining what outcomes of a study would lead to a rejection of the null hypothesis for a pre-specified level of significance.

As an example, consider a system that can receive input and that can generate output. As to input, consider, for example, offset well data from one or more oil and gas well construction activities databases, which can include time records for activities and/or non-production time (e.g., as may be caused by materialized risk events, etc.). As to output, consider, for example, a distribution model for one or more activities and/or non-planned events that can be used as a part of a model to simulate total well time estimation for constructing a part of or a complete well (e.g., oil well, gas well, oil and gas well, etc.). For example, based on the output probability distribution models for activities and non-planned events (e.g., including information about the frequency of non-planned events), a system can run a simulation to predict a confidence interval for the total construction time. In such an example, the simulation may be a Monte Carlo simulation.

As an example, a system may access information from one or more databases as to well construction processes for one or more wells in a field, which may be offset physically with respect to a well to be constructed. As an example, a system may access information from one or more databased as to well construction processes for one or more wells in a field that differs from a field where a well is to be constructed. As an example, a database may include one or more well time estimation models, which may be associated with actual activities with known times.

As an example, a system can include assessing one or more distribution models, which may generate assessment results. Such results may be stored and/or utilized to make storage determinations as to one or more distribution models. For example, where a particular well construction activity is assessed to be aligned with a selected distribution model, that distribution model may be tagged with an assessment metric such that, for a subsequent run with similar circumstances, the distribution model may be favored over one or more others (e.g., prior to and/or after hypothesis testing, etc.).

As an example, a system can calculate a "best" distribution model with "suitable" parameters based on existing samples (e.g., historical data from wells nearby or with similar characteristics).

As an example, a system can include a nonparametric back-up procedure that is triggered responsive to hypothesis testing results that indicate a parametric approach is inadequate. In such an example, nonparametric estimation can ensure the recommendation of a non-standard probability distribution model to compensate for the cases where when hypothesis testing failed to find the best-fit distribution from the standard probability distribution models.

As an example, a method can include providing parametric estimation and/or nonparametric estimation with hypothesis testing, which can scientifically quantify quality of a recommended model and parameters (e.g., how 'well' the output model fits the data).

As an example, a system can provide for automatic selection of a probabilistic model and its input parameters for well time estimation. Such a system can provide parametric estimation and nonparametric estimation, as appropriate, with hypothesis testing (e.g., to scientifically quantify suitability of an output model for given data).

As an example, a system can provide assurances that help to promote adoption over human selection approaches. For example, assurances can be through hypothesis testing and nonparametric back-up. As an example, a system may include a review graphical user interface (GUI) that allows for human intervention via an input device to a system, for example, to not accept a parametric or a nonparametric selection and, for example, to allow for human selection via one or more graphical controls of the GUI. As an example, assurances to promote adoption may include data from offset wells being conveyed via a display of a system, for example, rendered via a GUI. In such an example, a user may see how results of the automated selection process have performed and/or are performing for one or more other wells that have been constructed and/or that are being constructed. Where results are objectively driving toward optimal well construction, which may be visualized via presentation of metrics as to time, distance, rate of penetration of a drill bit of a drill string, etc., a user may gain confidence in automated selection. Further, such a GUI may allow a user to flag one or more sites for further analysis, whether as to benefits or detriments. Such flags may be associated with information in one or more databases, which may, for example, be utilized for subsequent automated selections, hypothesis testing, etc.

As an example, a system may operate without human intervention as to distribution model selection. As an example, a workflow may provide for autonomous well time estimation without manual selections by engineers.

As mentioned, a system can provide for parametric estimation and nonparametric estimation with hypothesis testing. As mentioned, nonparametric selection may be a back-up where, for example, hypothesis testing fails a parametric selection (e.g., or group of parametric possibilities). As an example, a recommendation process of nonparametric distribution and its generation of the probability distribution can help to assure that an adequate distribution is provided as an output. As an example, when hypothesis testing has determined that a group of possible parametric distributions are not suitable for obtained samples, a method can utilize an autonomous system to generate a nonparametric probability distribution alternatively.

As an example, as to well time estimation: well total time can be the total estimated time taken to construct one well from spud to rig release; inclusive of clean time, rig non-productive time (NPT) and risk NPT. As an example, clean time can be operational time as defined in the sequence of operations that contributes to drilling or completing a well, excluding NPTs and operational inefficiencies. NPT can be for interruptions to a sequence of operations that result in time delays. As an example, NPT may be separated into categories, such as, for example, rig related NPT and risk related NPT.

Figure 11:
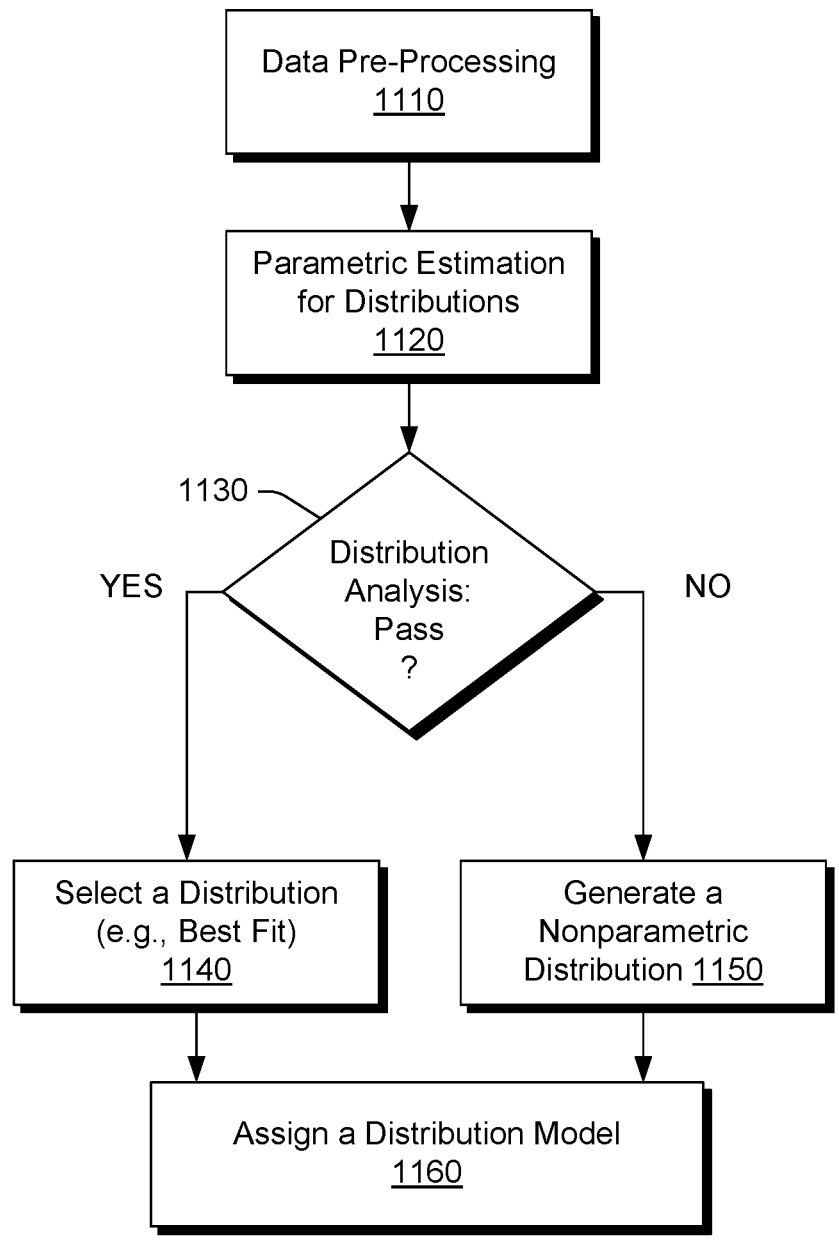
FIG. 11 illustrates an example of a method.

FIG. 11 shows an example of a method 1100 that includes a process block 1110 for data pre-processing; a parametric estimation block 1120 for estimating, parametrically, distributions; a decision block 1130 for analyzing estimated distributions (e.g., via hypothesis testing) and making decisions thereon; a selection block 1140 for selecting a best fit distribution of the parametrically estimated distributions per the analysis of the decision block 1130 where the decision block 1130 decides that one or more of those parametrically estimated distributions pass (e.g., pass hypothesis testing); a generation block 1150 for generating, nonparametrically, a distribution where the decision block 1130 decides that no parametrically estimated distribution passes (e.g., fail hypothesis testing); and an assignment block 1160 for assigning a distribution model (e.g., for purposes of one or more well construction processes).

As an example, the method 1100 can be executed serially and/or in parallel. For example, the data pre-processing of the process block 1110 can include segregating data into parts where each part may be processed to have a corresponding assigned distribution model. As an example, the process block 1110 may receive and process a dataset that is for a plurality of different field operations. In such an example, the method 1100 may assign different types of distribution models such that an overarching model is heterogeneous (e.g., some standard distribution models, some non-standard distribution models, etc.). Such an approach can improve estimations for field operations and, hence, performance of such field operations. In such an example, the process block 1110 may provide output processed data to a plurality of instances of the blocks 1120, 1130, etc. As an example, a parallel process may provide for faster results, which may provide for faster comparisons between distribution models of different types of field operations, etc. For example, two parallel instances may output two different distribution models to a display such that an operator can discern that the field operations performed are heterogeneous with respect to their distribution models (e.g., actual execution time characteristics).

As an example, a method such as the method 1100 may operate in real-time where field data are received and processed. In such an example, a resulting assigned distribution or distributions may be utilized to revise a plan for field operations where at least one of such field operations is then performed according to the revised plan. Where a feedback loop exists for on-going field operations, revisions may occur multiple times. As an example, a particular type of field operation may be assigned one type of distribution model at an early time during a workflow and a different type of distribution model at a later time during the workflow. For example, physical conditions that occur during drilling may differ depending on measured depth of a borehole being drilled. In such an example, the character of a time distribution of a field operation may differ depending on one or more factors, for example, consider a lag time of an action that increases with increasing depth of a borehole.

As an example, the process block 1110 may process data of a dataset with respect to type of field operation and optionally operational sequence (e.g., earlier, later, before Y, after X, etc.). As an example, the process block 1110 may process data of a dataset to assure a particular number of samples (e.g., total counts, etc.) for purposes of enhancing an ability to test a hypothesis. For example, where a dataset includes 30 samples that could possibly be disaggregated into three sets of 20, 8 and 2, the process block 1110 may refrain from doing so as two samples may be too few for robust hypothesis testing. As an example, data pre-processing may operate according to one or more parameters as to number of samples (e.g., counts). As an example, where the method 1100 is performed in real-time, early data of a type of field operation may be aggregated for purposes of assisting with hypothesis testing and subsequently be disaggregated as more samples (e.g., counts) are received.

As an example, the method 1100 can be implemented for assigning a modeling probability distribution for one or more well activities times as may be for one or more types of field operations associated with a well. As to a standard distribution, consider one or more of the following examples: normal, lognormal, gamma, Weibull, uniform, triangle distribution, etc.

As to the process block 1110, data pre-processing can include acquiring historical data or offset well data, which may include one or more erroneous data points, outliers, or nans (not a number) in the datasets. To reduce risk of errors in statistical testing, pre-processing of data can be implemented. As explained, pre-processing may be implemented for one or more purposes and/or pre-processing may be adjusted over time, for example, for a real-time execution of the method 1100.

As to the estimation block 1120, one or more parametric estimation methods, such as maximum likelihood estimate (MLE) and minimum estimation method (MEM), can be applied to determine corresponding parameters of a default standard distribution or distributions. For example, consider a normal distribution where the probability density function (PDF) is as follows:

$$p(x) = \frac{1}{\sqrt{2\pi\sigma^2}} \exp\left\{-\frac{(x-\mu)^2}{2\sigma^2}\right\}$$

And estimates of parameters can be:

$$\hat{\mu} = \bar{x}, \hat{\sigma} = \sqrt{s_x^2}$$

In the foregoing example, values of p can be plotted versus values of x as a distribution density "curve". As to the decision block 1130, which may be two separate blocks (e.g., one for testing and one for deciding), an estimated set of parametric probability distributions can be tested as estimated by the block 1120. One or more hypothesis testing methods can be applied to check whether one or more of the standard distribution models passes hypothesis testing or not. If one or more pass, then the method 1100 can proceed to the selection block 1140; whereas, failure can cause the method 1100 to proceed to the generation block 1150.

As an example, for a "YES" branch of the decision block 1130, the method 1100 can proceed to the selection block 1140; otherwise, the method 1100 can automatically proceed to the generation block 1150. As to the selection block 1140, the method 1100 can select the best-fit probability distribution model as one to be assigned per the assignment block 1160.

As to the generation block 1150, which follows the "NO" branch of the decision block 1130, it can try to generate a nonparametric probability distribution based on existing data samples.

As mentioned, the assignment block 1160 can assign a probability distribution model, which may be a parametric one or a nonparametric one.

As to parametric estimation with hypothesis testing, a method can include estimating the corresponding parameters of standard distributions and then using the following rule to choose the best distribution:

Assume the time of one operation or non-production duration to be estimated is X, which is subject to one of a plurality of standard distributions, such as lognormal, gamma, Weibull and so on. Assume a sample of $X=\{x_1, x_2, \ldots, x_i, \ldots, x_n\}$ from the offset well data. As an example, a method can include using a parametric estimation method (PEM) such as a maximum likelihood estimation (MLE) method to determine the corresponding parameters of the standard distributions.

The method of maximum likelihood can be utilized to select the set of values of the model parameter that maximize the likelihood function. In practice, it may be convenient to work with the natural logarithm of the likelihood function, called the log-likelihood:

$$l(\theta;x) = \ln L(\theta;x)$$

or the average log-likelihood:

$$\hat{l}(\theta;x) = \frac{1}{n}\ln L(\theta;x)$$

The hat over l indicates that it is akin to an estimator; where $\hat{l}$ estimates the expected log-likelihood of a single observation in the model.

The method of maximum likelihood can find one or more values of θ that maximize l(θ;x). This method of estimation defines a maximum likelihood estimator:

$$\hat{\theta} \in \left\{ \underset{\theta \in \Theta}{\operatorname{argmax}} \hat{l}(\theta;x) \right\}$$

if a maximum exists. An MLE can be the same regardless of whether a method maximizes the likelihood or the log-likelihood function, because log is a strictly increasing function.

As to testing, as an example, a hypothesis testing method such as the Kolmogorov-Smirnov test can be used to check whether data X follows the standard distributions or not. In such an example, if the p-value of the test is smaller than a certain validation threshold, then the method can refuse the assumption that data X comes from the distribution; otherwise, the assumption cannot be refused.

For the distributions that pass the assumption, a method can include, for example, calculating a rank for each of them, e.g. the sum of probabilities of the data points. In such an example, the higher the rank, the better the distribution which is suitable for the obtained sample data X. And considering distributions that are continuous, the probability of one data point falling into its neighborhood can be used to approximate the probability of the data point under certain distribution. In such an approach, a method can choose the distribution with the highest rank.

As to nonparametric estimation, if parametric estimation with hypothesis testing failed for the standard probability distribution models, a non-standard distribution model can be implemented to perform calculations.

As an example, nonparametric statistics can based on either being distribution-free or having a specified distribution but with the distribution's parameters unspecified. Such an approach allows the functional form of a fit to data to be obtained in the absence of guidance or constraints from theory. As a result, the procedures of nonparametric estimation may be viewed as lacking meaningful associated parameters.

Consider the following example of a nonparametric technique that involves kernel estimation:

Let $(x_1, x_2, \ldots, x_n)$ be a univariate independent and identically distributed sample drawn from some distribution with an unknown density $f$. A method can aim for estimating the shape of this function $f$. Its kernel density estimator can be written as:

$$\hat{f}_h(x) = \frac{1}{n}\sum_{i=1}^{n} K_h(x-x_i) = \frac{1}{nh}\sum_{i=1}^{n} K\left(\frac{x-x_i}{h}\right)$$

where K is the kernel, a non-negative function that integrates to one, and h>0 is a smoothing parameter called the bandwidth. A kernel with subscript h is called the scaled kernel and defined as $K_h(x)=1/hK(x/h)$. A range of kernel functions can be used, such as, for example, uniform, triangular, and so on.

Using a nonparametric estimation, a non-standard distribution model can be recommended to compensate (e.g., to compensate for a failure of a parametric approach).

As to pre-processing of data, as an example, it may include one or more of data cleaning, normalization, etc. As an example, data may be cleaned using one or more statistical techniques, for example, to remove outliers (e.g., extreme values), etc.

As an example, a recommended distribution model may be sensitive to data, especially records with extreme values. As an example, one or more GUIs may provide results from pre-processing such that a user may be able to visualize results as to proper pre-processing (e.g., to help with estimation and/or generation and assignment of a distribution). As an example, a GUI may allow for user intervention in pre-processing, for example, to remove one or more outliers, etc.

For automated well time estimation, two examples are explained below based on data from field operations (see Table 1 and Table 2). Table 1 corresponds to an example of circulation operation as a part of a drilling dataset where parametric estimation is applied to determine corresponding parameters. In the example of Table 1, hypothesis testing is performed to calculate a p-value, which can be utilized to determine whether to accept a distribution model or to not accept a distribution model. In the example of Table 1, a lognormal distribution passes hypothesis testing.

TABLE 1

| Dataset—Drilling | Circulate | |
|---|---|
| Data (time) | Frequency (counts) |
| 0.5 | 10 |
| 1.0 | 4 |

TABLE 1-continued

Dataset—Drilling | Circulate

| Data (time) | Frequency (counts) |
|---|---|
| 1.5 | 1 |
| 2.0 | 2 |
| 2.5 | 1 |

Figure 12:
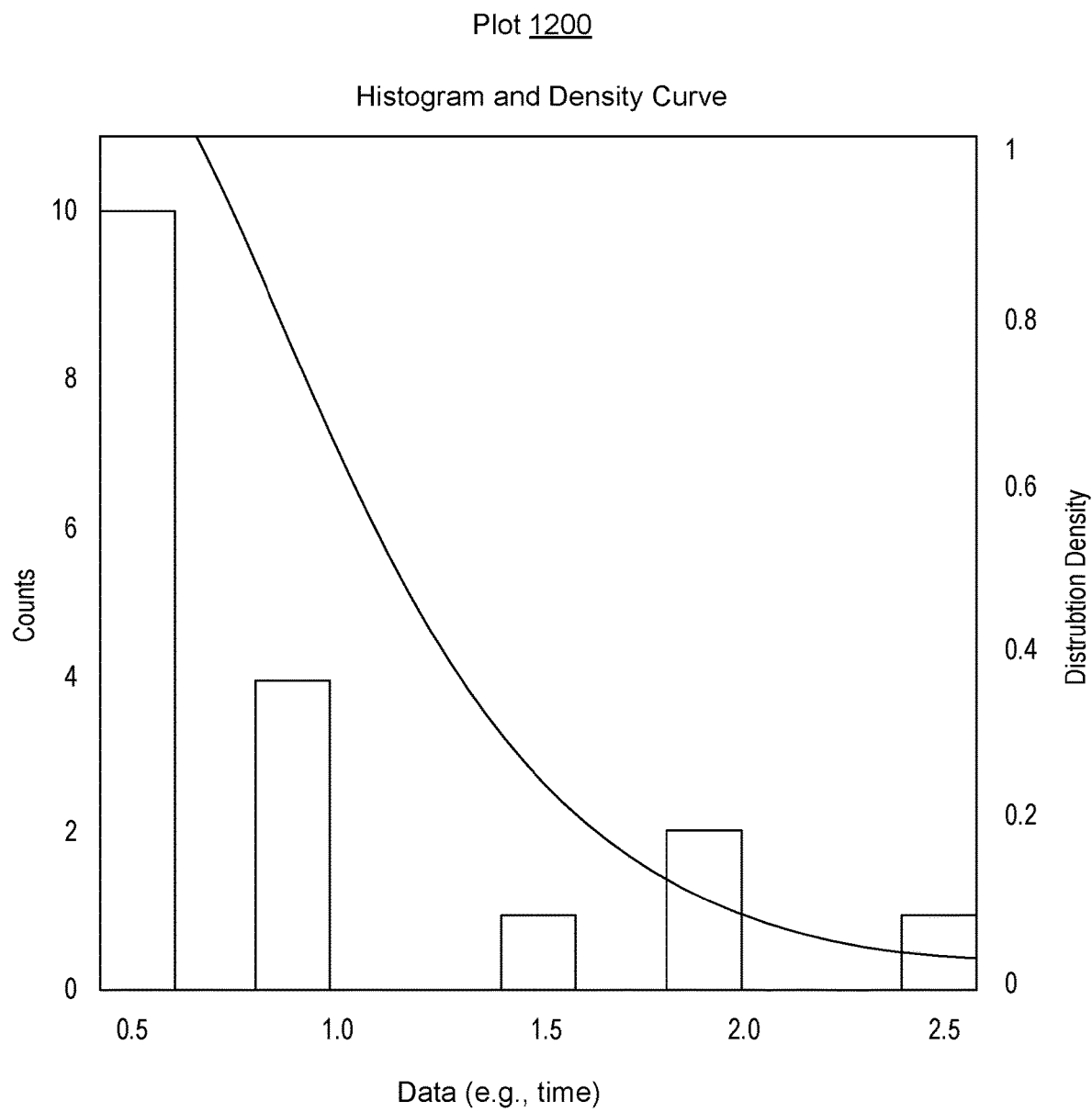
FIG. 12 illustrates an example of a plot.

FIG. 12 shows a plot 1200 of the lognormal distribution as an assigned output as the method 1100. As shown, the plot 1200 includes a histogram with values for the data (e.g., time) and frequency counts of Table 1 along with a distribution density curve. The highest count value is 10 for the datum 0.5 (e.g., 0.5 hours); whereas, the data 1.5 and 2.5 each have a single count (e.g., a count value of 1). The data are shown as being organized from low to high values with corresponding counts (e.g., frequency of those values for particular circulation operations). As shown in the plot 1200, a distribution density of unity (1) is at a lower value (e.g., about 0.6), a distribution density of approximately 0.5 is for a higher value (e.g., about 1.0) and distribution density values tail off relatively monotonously for yet higher values.

Table 2 shows another part of a drilling dataset where parametric estimation is applied to determine corresponding parameters. Specifically, the example data correspond to installation of a wear bushing in a well head assembly as a type of field operation. In the example of Table 2, the standard probability distributions models fail hypothesis testing; thus, a non-standard distribution model may be recommended, for example, as an automatically determined model responsive to failure of the standard probability distributions models.

TABLE 2

Dataset—Well Head Assembly | Install Wear Bushing

| Data (time) | Frequency (counts) |
|---|---|
| 0.25 | 2 |
| 0.5 | 23 |
| 0.75 | 1 |
| 1.0 | 7 |
| 1.5 | 2 |

Figure 13:
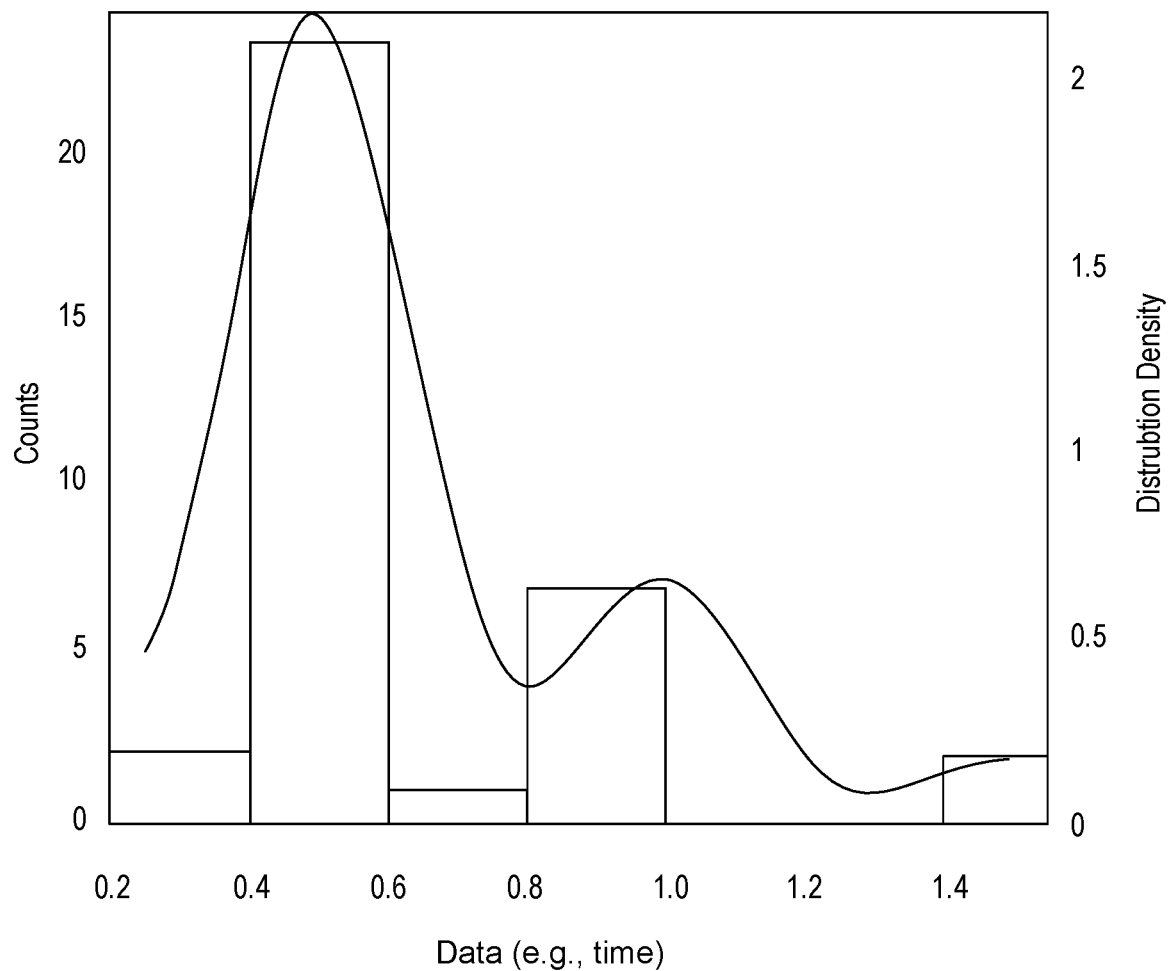
FIG. 13 illustrates an example of a plot.

FIG. 13 shows a plot 1300 of an assigned non-standard distribution model after calculation. As shown, the distribution density is multi-modal, with a higher peak of approximately 2 at a data value of around 0.5 and a lower peak of approximately 0.7 at a data value of around 1.0.

The plots 1200 and 1300 of FIGS. 12 and 13 may be compared to understand better circumstances that may be suitably approached with parametric estimate distributions and circumstances that may be suitably approached with nonparametric estimate distributions. The plot 1300 is associated with one type of field operation ("Well Head Assembly|Install Wear Bushing") while the plot 1200 is associated with another type of field operation ("Drilling|Circulate"). As may be appreciated, well construction involves a combination of assembly and operations such as putting pieces together and making fluid flow (e.g., completion operations, mud circulation operations, etc.). Such actions (e.g., field activities) can be interrelated. A method such as the method 1100 may alleviate burden on humans in optimizing a well construction process, which may be represented digitally as a digital plan.

As an example, the method 1100 can be performed utilizing a plurality of different types of distributions and can parse data for different types of field operations, which may or may not be interrelated. As explained with respect to the examples of Table 1 and FIG. 12 and Table 2 and FIG. 13, a field operations dataset can include data for different types of field operations where each of those field operations may be characterized by a particular type of distribution. Such an approach provides for distribution heterogeneity, which can be automatically determined using hypothesis testing. As an example, the method 1100 can improve determinations as to field operations through characterizing particular field operations differently via automated hypothesis testing.

As an example, the method 1100 can include pre-processing data in one or more manners such that a plurality of portions result where each portion can be subjected to appropriate blocks of the method 1100 to result in an appropriate assigned distribution model at the assignment block 1160. As an example, some types of field operations may be less certain as to time or times than others. Further, depending on the number of individual actions of a field operation, a distribution may be multi-modal. For example, consider a field operation where an early action may possibly be time consuming though, if time consuming, a later action is likely less time consuming; whereas, if the early action is less time consuming, then the later action may consume more time. Data for such a field operation may result in, or be characterized by, a multi-modal distribution. Where other field operations overlap (e.g., in whole or in part) or are otherwise dependent on the aforementioned example of a field operation, they may be impacted by the multi-modal character of that field operation. Such interrelatedness of field operations is not readily apparent from a "one-size fits all" approach to distribution models. As explained, a method such as the method 1100 of FIG. 11 can improve estimations as to time or times by assigning distribution models in a more discrete manner. As shown in FIG. 11, such a discrete manner can include rejecting one or more parametric distributions and automatically generating a non-parametric distribution. As an example, a plurality of field operations may be represented as a heterogeneous set of distribution models.

While models of probability distributions are presented in various examples, one or more alternatives and/or additions may be utilized. For example, information as to probability may be in another form where it can be utilized for purposes of well construction time estimations as to one or more activities.

As an example, a workflow can include automatically specifying a probability distribution model for a type of well construction activity, or non-planned events (non-productive time), from offset well data, where the workflow includes parametric estimation with hypothesis testing and/or nonparametric estimation with hypothesis testing. As explained with respect to the method 1100 of FIG. 11, nonparametric estimation (e.g., or another type of estimation) may be provided as a back-up to parametric estimation. As an example, a method can be tiered where one or more tiers are back-up tiers to parametric estimation, which may be triggered automatically in response to analysis of parametric estimated distributions as subjected to testing, etc.

Figure 14:
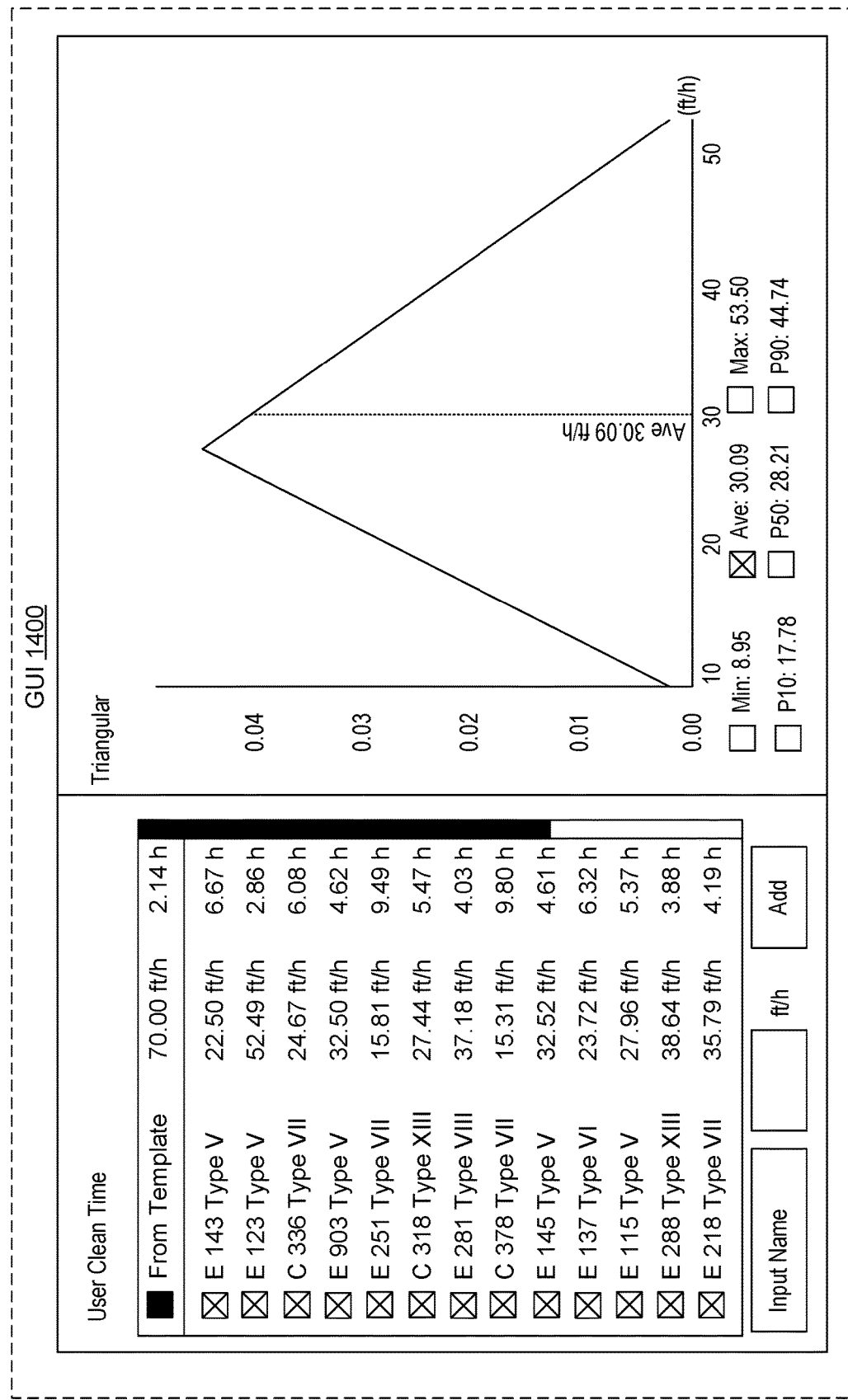
FIG. 14 illustrates an example of a graphical user interface.

FIG. 14 shows an example of a GUI 1400, rendered to a display (see, e.g., dashed line as representing a display), that includes a triangular distribution. The GUI 1400 shows a listing of various wells that can be selected such that their data are accessed for determining a distribution, which may be a distribution determined using a process that implements hypothesis testing to accept or reject a distribution (e.g., pass/fail). As an example, a number of distributions may be ranked as to fit where a "best fit" distribution may be selected and output for use in making estimations with respect to time for an activity or activities. As an example, for particular data, at a particular time, the triangular distribution may be a "best fit".

Figure 15:
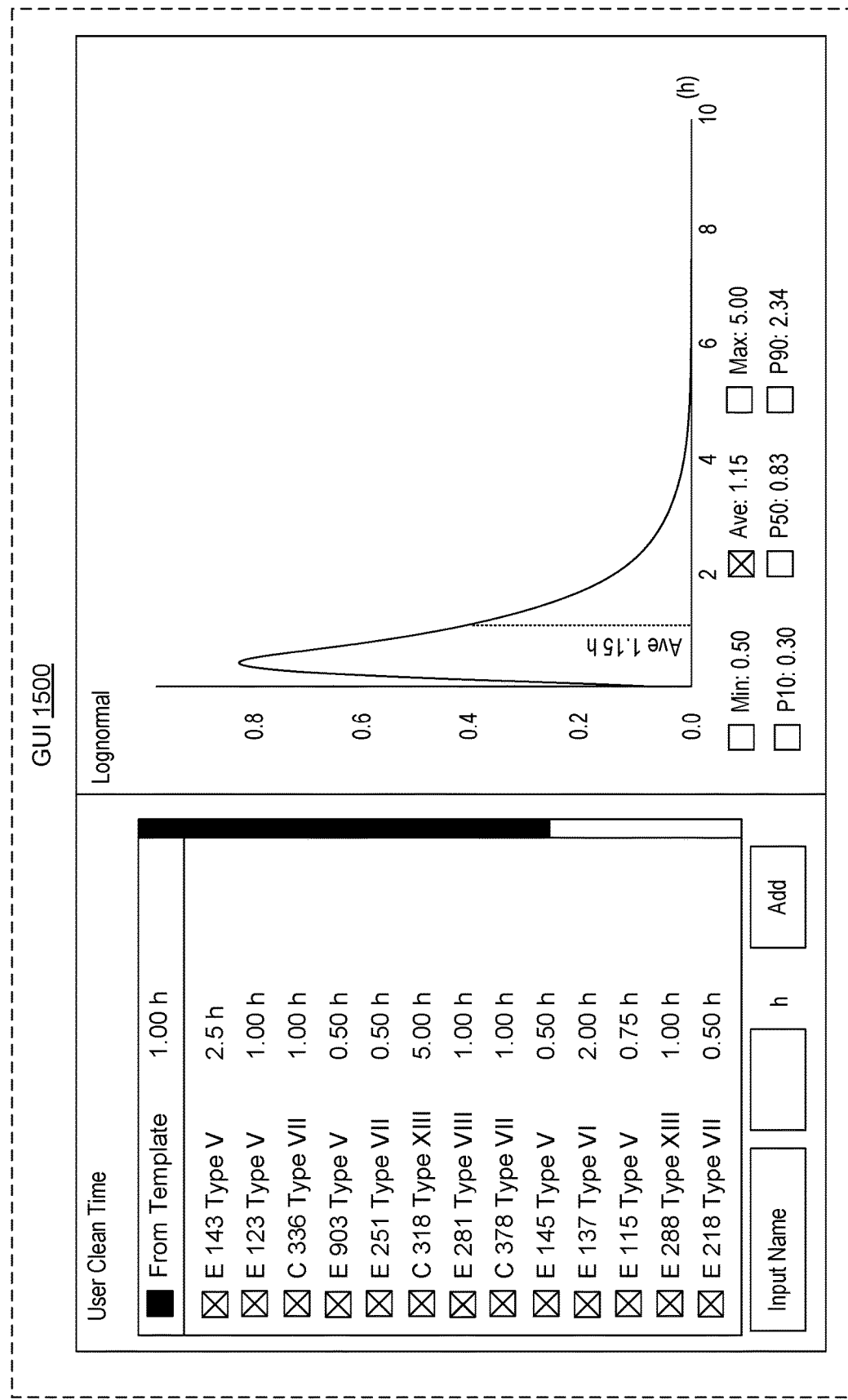
FIG. 15 illustrates an example of a graphical user interface.

FIG. 15 shows an example of GUI 1500, rendered to a display (see, e.g., dashed line), that includes a lognormal distribution. The GUI 1500 shows a listing of various wells that can be selected such that their data are accessed for determining a distribution, which may be a distribution determined using a process that implements hypothesis testing to accept or reject a distribution (e.g., pass/fail). As an example, a number of distributions may be ranked as to fit where a "best fit" distribution may be selected and output for use in making estimations with respect to time for an activity or activities. As an example, for particular data, at a particular time, the lognormal distribution may be a "best fit".

Figure 16:
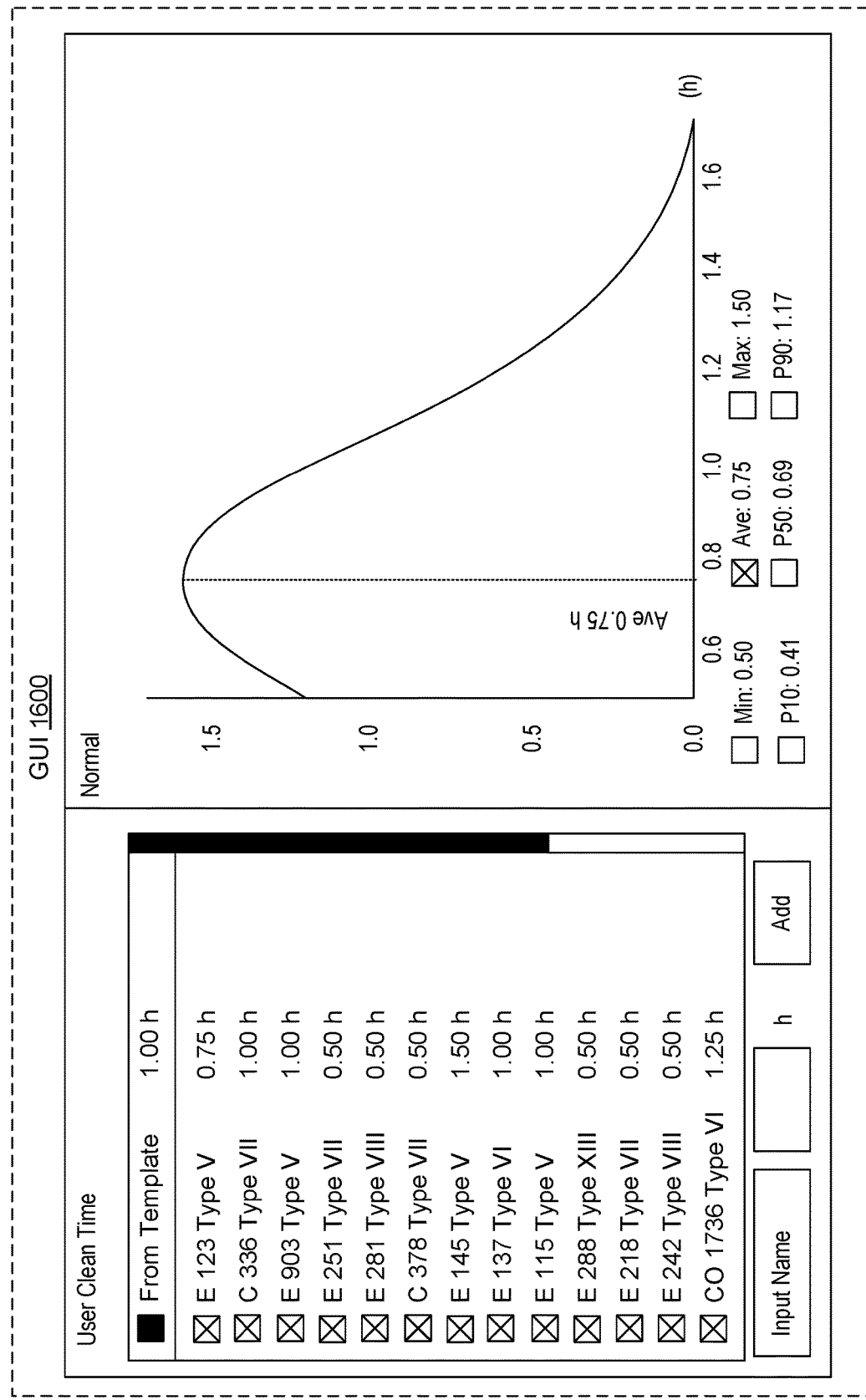
FIG. 16 illustrates an example of a graphical user interface.

FIG. 16 shows an example of GUI 1600, rendered to a display (see, e.g., dashed line), that includes a normal distribution. The GUI 1600 shows a listing of various wells that can be selected such that their data are accessed for determining a distribution, which may be a distribution determined using a process that implements hypothesis testing to accept or reject a distribution (e.g., pass/fail). As an example, a number of distributions may be ranked as to fit where a "best fit" distribution may be selected and output for use in making estimations with respect to time for an activity or activities. As an example, for particular data, at a particular time, the normal distribution may be a "best fit".

Figure 17:
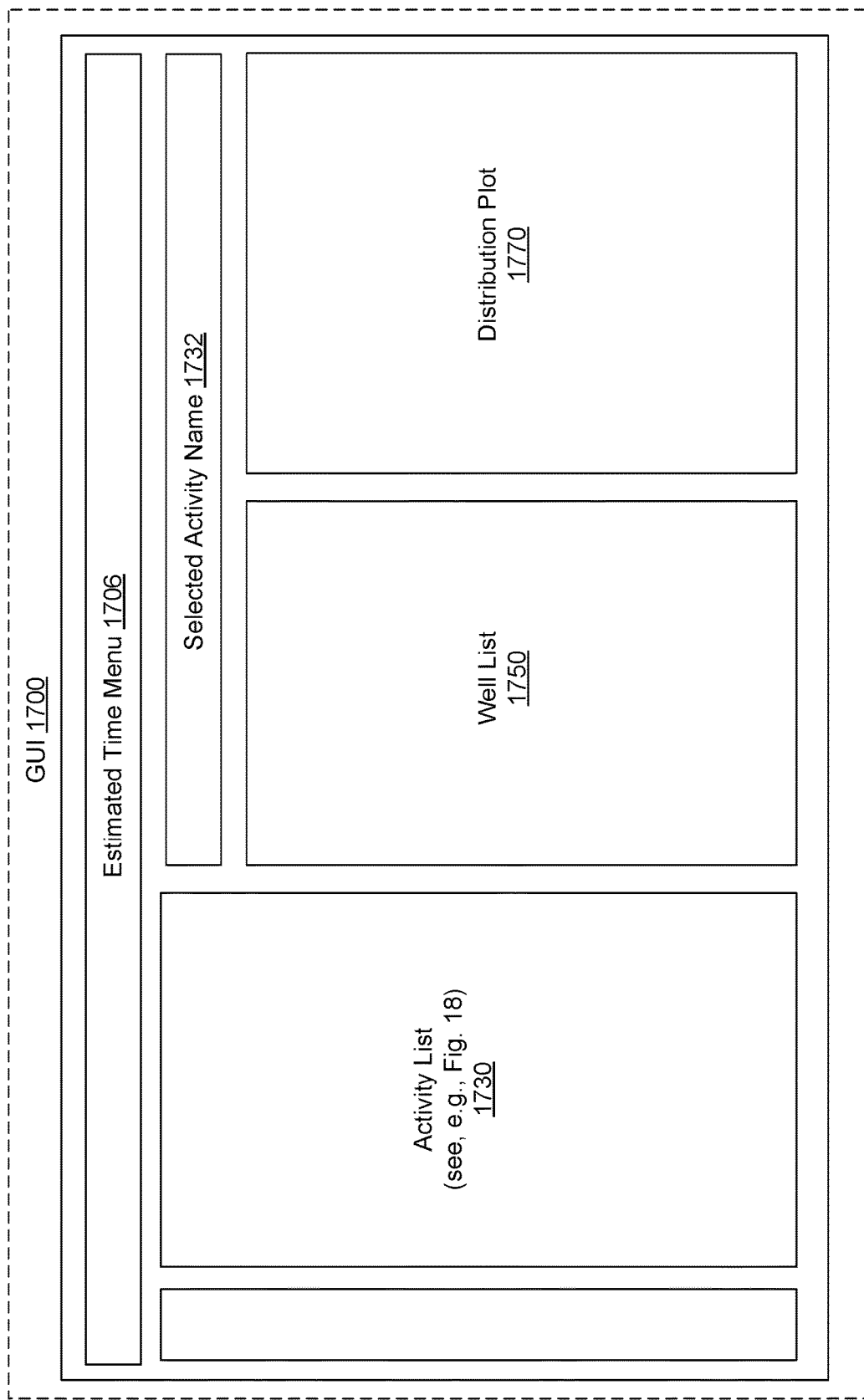
FIG. 17 illustrates an example of a graphical user interface.

FIG. 17 shows an example of a GUI 1700 that includes various menus, fields and panels, which include an estimated time menu 1706, an activity list panel 1730, a selected activity name field 1732, a well list panel 1750, and a distribution panel 1770. The GUI 1400 shows a well list panel and a distribution panel with an example of a triangular distribution, the GUI 1500 shows a well list panel and a distribution panel with an example of a lognormal distribution, and the GUI 1600 shows a well list panel and a distribution panel with an example of a normal distribution. As demonstrated, various types of activities can have various types of distributions using data from one or more selected wells. Such wells can include wells that have been constructed and wells under construction. Wells can include vertical wells, deviated wells, etc.

As an example, the GUI 1700 can be part of a computational framework, which may be operatively coupled to one or more systems such as, for example, the wellsite system 200 of FIG. 2, the system 300 of FIG. 3, the system 400 and/or the system 470 of FIG. 4, a system that renders the GUI 500 of FIG. 5, a system that renders the GUI 600 of FIG. 6, the system 790 of FIG. 7, the system 800 of FIG. 8, the system 900 of FIG. 9, etc. (see also, e.g., FIGS. 27 and 28).

As an example, a well may be a horizontal well that includes a horizontal portion that extends in a lateral reservoir, which may be subjected to fracturing (e.g., hydraulic fracturing). In such an example, various activities can depend on measured depth, which may depend on borehole angle. For example, one or more activities in a horizontal portion can differ from one or more activities in a vertical portion or a portion that provides for a transition from vertical to horizontal. Various portions of a well may be referred to as sections. As an example, a well can include sections defined by vertical depth, measured depth, borehole size, casing size, perforations, fractures, etc. As an example, a framework may automatically segregate a dataset into portions that correspond to sections of a well.

FIG. 18 shows an example of an activities GUI 1830, which may be rendered in a GUI such as the GUI 1700, for example, in the activity list panel 1730. The GUI 1830 includes a construct well heading along with a sub-heading such as a construct section sub-heading, which indicates a section with a diameter of 17.5 inches. The construct section sub-heading includes additional sub-headings, which include corresponding sub-headings. As shown, the activities GUI 1830 can provide for a hierarchical listing of activities, which may be displayed using graphical controls. Such activities can provide making time estimates of a well. As shown, time estimates can be on a per activity basis, which may be aggregated on a drilling run basis, a casing run basis, a cementing basis, a surface stack basis, a section basis, etc.

As shown, the section can involve one or more drilling runs, which may be specified according to depth, which can be vertical depth or measured depth. A drilling run can include activities such as a safety meeting, making up a BHA, tripping in to a depth, drilling to a depth, circulating to condition the drilled borehole, pumping, tripping out and laying down the BHA at the surface. As an example, a casing run can include a safety meeting, setting up a rig to run casing, making up a shoe track, running casing to a depth, circulating to condition the hole, and adjusting a rig after the casing run. As an example, a cementing operation can include a safety meeting, setting up a rig to cement casing, performing a single stage casing cementing operation, and adjusting the rig after the cementing operation. As an example, various surface activities may be listed such as, for example, cutting casing as a surface operation.

As an example, a GUI can include a setting feature that allows for selection of a type or types of technique such as, for example, probabilistic or deterministic (see, e.g., GUIs 2210 and 2230 of FIG. 22). As an example, consider a user selection of "deterministic" where for a rate of penetration (ROP), which may be referred to as a speed, can determine an average speed using a number of offset wells (OW) from 1 to n (e.g., OWAve=OW1 speed+OW2 Speed . . . +OWn Speed)/n). In such an example, a time can be determined for a drilling activity using a depth range divided by the average speed (e.g., OWAve).

As another example, consider a user selection of "probabilistic" where the user selects a number of offset wells and where a computation framework renders a plot to a display to show a determined "best fit" distribution for the selected number of offset wells. Such a determination can include performing a Monte Carlo method that can "roll" a number of times (e.g., 1000 times, etc.) on each plot for each activity. The results of each roll (e.g., trial) can be ordered, for example, from smaller to larger. As an example, a method can include summing a number of activities at the same position to provide a new distribution (see, e.g., the GUI 2210 of FIG. 22 and selections for "Probabilistic: ΣClean time+Risk NPT" and "All Activities"). In such an approach, where a user selects "P50" in a GUI (e.g., setting dialog box, etc., see, e.g., "P60" in the GUI 2210 of FIG. 22), the "P50" can be based on the new distribution. Such an approach can account for time based activities and rate based activities (e.g., speed based activities) to provide an appropriate P-based estimate.

As an example, a method can include accounting for a risk of non-productive time (NPT). For example, consider using a Monte Carlo method for an offset well NPT analysis such that output can be for both clean time and NPT (e.g., total time=clean time+NPT).

In the example of FIG. 18, the GUI 1830 shows times in hours as "clean" Pmean and total Pmean and cumulative time in days. As shown, the activities listed are shown in a sequence that can be performed sequentially such that individual times can be summed to provide individual cumulative times. As shown, an activity listed as "Drill to depth (30-2030 ft)" has a clean Pmean of 92.76 hours (3.865 days) and a total Pmean of 95.74 hours (3.99 days). The cumulative time of 0.74 days is incremented by 3.99 days for a total of 4.73 days. In the example of FIG. 18, Pmean is utilized for a corresponding distribution, which can be a selected distribution (e.g., a "best fit" distribution, etc.). As an example, a different statistic may be utilized and/or a different distribution utilized. As an example, a user may select a statistic such as P90 where P90 times are rendered to the GUI 1830 rather than Pmean times. As shown in the GUI 1600 of FIG. 16, various check boxes can be rendered along with a distribution plot where a user may select one or more of such check boxes to cause rendering of an indicator such as the "Ave." indicator (e.g., Pmean). As an example, the P50 indicator may be selected, which can cause rendering of a vertical line at 0.69 hours. A user may compare the two times and then decide which one to select for purposes of an activity list and, for example, cumulative time. Such a selection may be applied to a plurality of distributions, which can be different types of distributions. For example, selection of Pmean can be used to provide a Pmean time of a normal distribution for one activity and a Pmean time of a lognormal distribution of another activity.

The timing and duration of development activities can depend on a variety of factors and with some amount of uncertainty. When scheduling first production dates, a forecaster can consider various factors that may come into play (e.g., economics, weather, landowner approval, rig availability, regulatory constraints, facilities capacity, etc.). Historical data and analogs may help improve confidence when scheduling new wells and developments in both short-term and long-term forecasting and corresponding uncertainty. As an example, a method can include utilizing a time estimation framework that can automatically assign distributions to activities for estimating a first production date and/or one or more production related activities after a first production date.

As various activities tend to aim at increasing production from an asset (e.g., a reservoir), various activities may also have a short term negative impact on production, which may be include downtime or deferment (e.g., types of non-productive time (NPT)), which may occur during such activities (e.g., or between activities, etc.). Some examples can include plant turnarounds, maintenance work, well workover and stimulations, shutting in offset wells during drilling and completions and facilities tie-ins/construction. Projects such as these may be pre-approved and scheduled such that associated downtime can be explicitly modeled in a production forecast, with some acknowledgment of uncertainty in the timing and duration of these activities.

As an example, a probability distribution that can be based on activity data can provide a manner to account for downtime, deferment, etc., and, for example, uncertainty. While an example of using a P50, Pmean (e.g., Pave), etc., can be applied to a plurality of probability distributions, a method can include individually selecting values for one or more probability distributions of activities and utilizing such values for estimating a cumulative time. In such an example, the cumulative time can be heterogeneous with respect to value (e.g., include both Pmean and P50, etc.). As an example, a cumulative time may be based on a homogeneously selected P value (e.g., Pmean or P50, etc.). As an example, a cumulative time may be based on heterogeneous probability distributions (e.g., normal and lognormal, etc.). As an example, a cumulative time may be based on homogeneous and/or heterogeneous probability distributions and/or P values.

In the example GUI 1830, an activity in the activity list may be selected and information therefore may be rendered in a well list panel and in a distribution panel (see, e.g., the well list panel 1750 and the distribution panel 1770 of FIG. 17).

Figure 19:
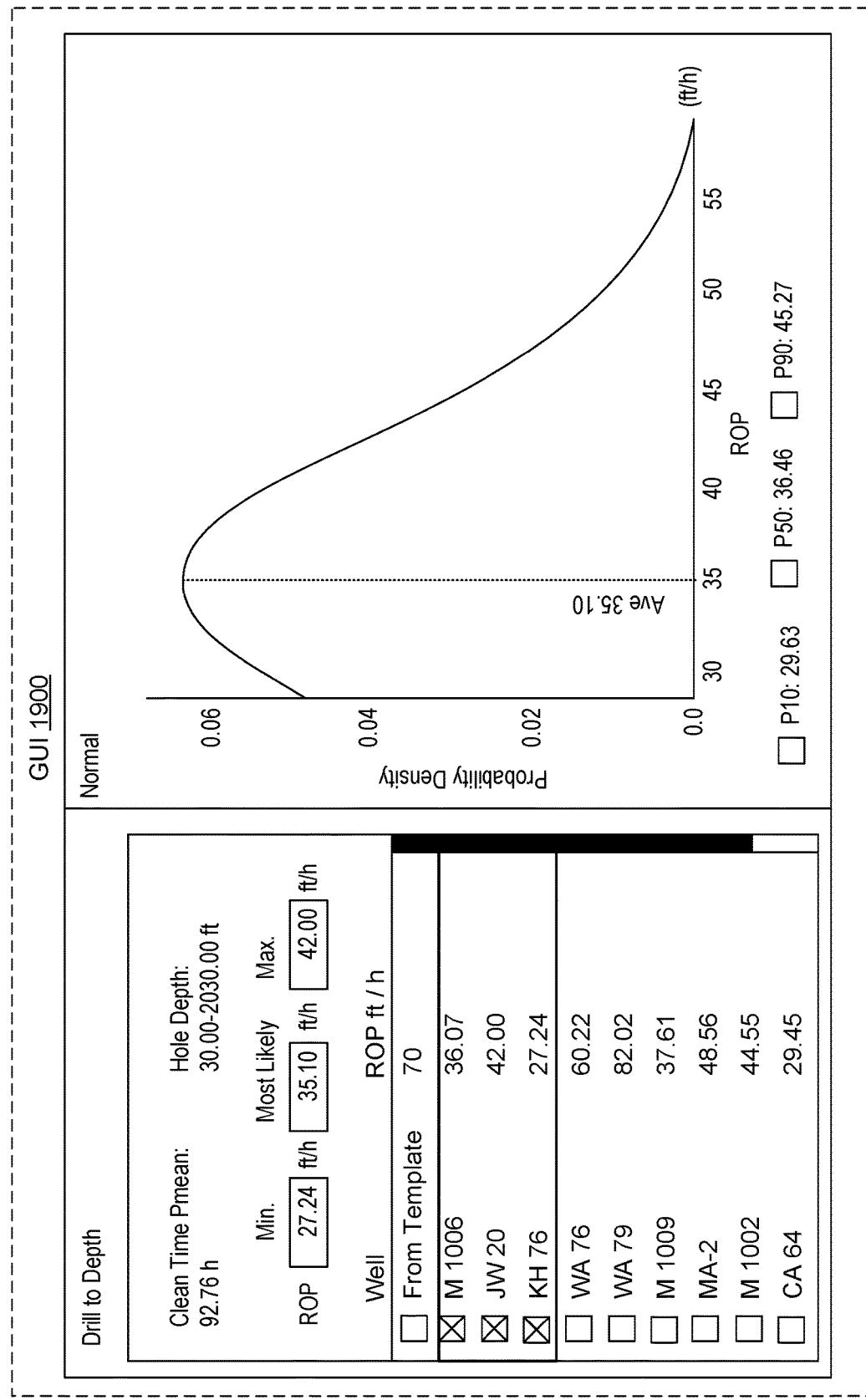
FIG. 19 illustrates an example of a graphical user interface.

FIG. 19 shows an example of a GUI 1900 that includes a well panel and a probability distribution panel that correspond to the selected activity in the GUI 1830. As shown, three wells are selected and a corresponding determined probability distribution rendered along with an average rate of penetration (ROP) (e.g., Pmean) in units of speed (e.g., feet per hour, meters per hour, etc.). The Pmean time is indicated to be 92.76 hours for drilling of the hole from a depth of 30 feet to 2030 feet. The probability distribution is determined to be a normal distribution utilizing ROP values of 36.07, 42 and 27.24 feet per hour (e.g., Pmean=(36.07+42+27.24)/3). To determine an estimated time, a distance with units of length can be utilized. For example, for a speed or a velocity or a rate in feet per hour, a distance in feet may be utilized. In the GUI 1900, the selected activity is "Drill to depth" with a hole depth of "30.00-2030.00", which means that drilling is for approximately 2000 ft (e.g., a borehole section of 2000 ft in measured length). In contrast to an example where probability density is plotted with respect to hours, for a speed or a velocity or a rate, the x-axis corresponds to shorter times. As mentioned, a probabilistic approach can account for activities that include hours, speed, etc.

As an example, a distribution, a time, a rate, etc., may be determined using one or more factors and/or terms that can account for non-productive time (NPT). For example, consider a percentage factor that can add a percentage of a time or times to a total time. As an example, a clean time can be a time that does not include an additional time such as a NPT (e.g., or factor, etc.).

Figure 20:
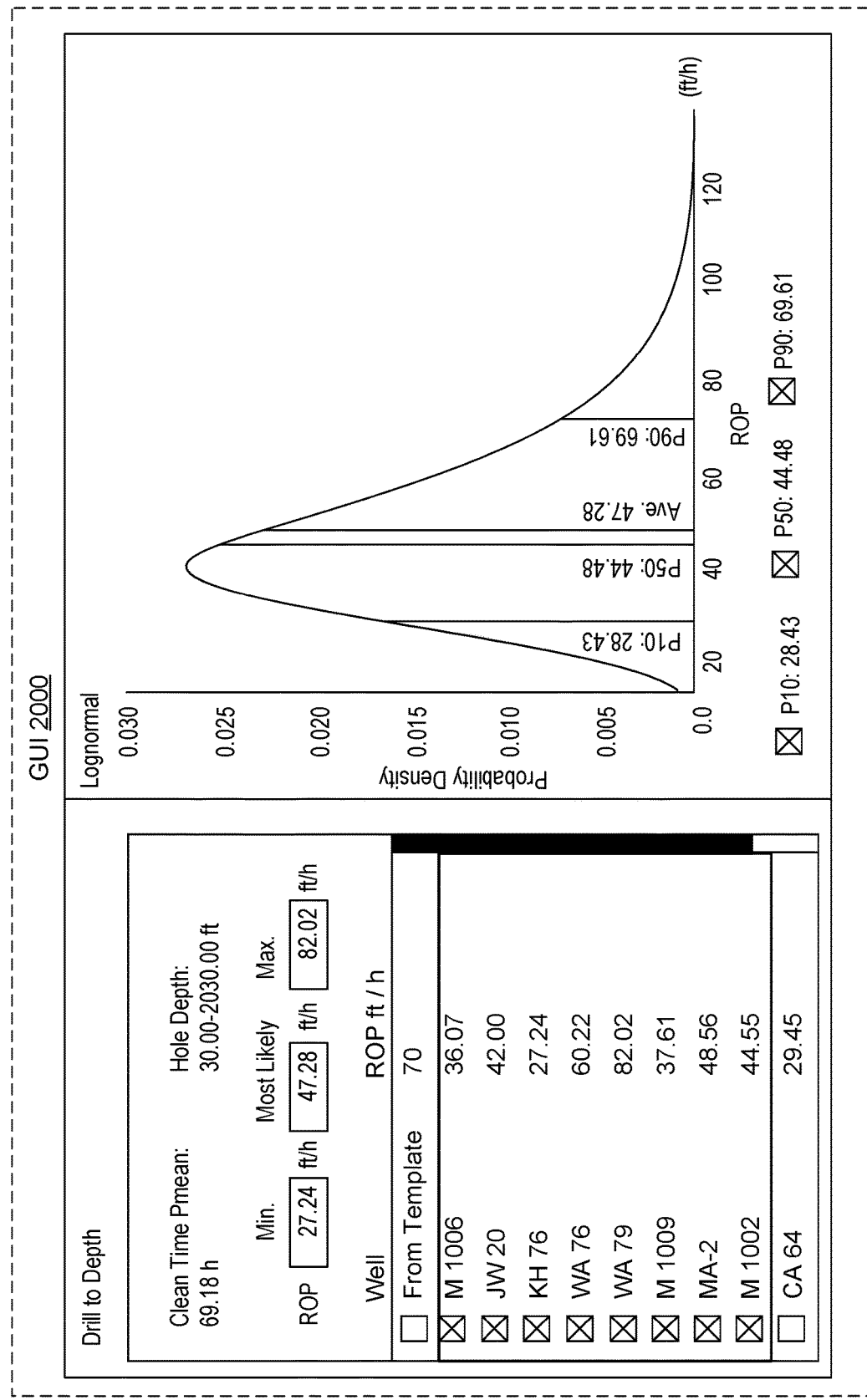
FIG. 20 illustrates an example of a graphical user interface.

FIG. 20 shows an example of a GUI 2000 that includes a different number of selected wells. In the example of FIG. 20, the distribution is a lognormal distribution, noting that in FIG. 19, the GUI 1900 showed a normal distribution. Such GUIs demonstrate how selection of wells can change the output. For example, upon a selection, a method can determine a type of distribution, which may be performed in a relatively real-time manner (e.g., in an interactive manner). As a user changes a selection (e.g., de-selects, selects another, selects an additional, etc.), a method can, as appropriate, determine another, different type of distribution. In such an approach, as the method can operate in an interactive manner, a user may be able to visualize how a distribution changes in response to selection of number of wells, types of wells, etc. As an example, where a method operates to receive data in real-time from one or more wells (e.g., one or more selected wells), the method may automatically update (e.g., re-determine) a distribution, which may include altering the type of distribution (e.g., determining that a different type of distribution provides a more suitable fit to the underlying data).

Figure 21:
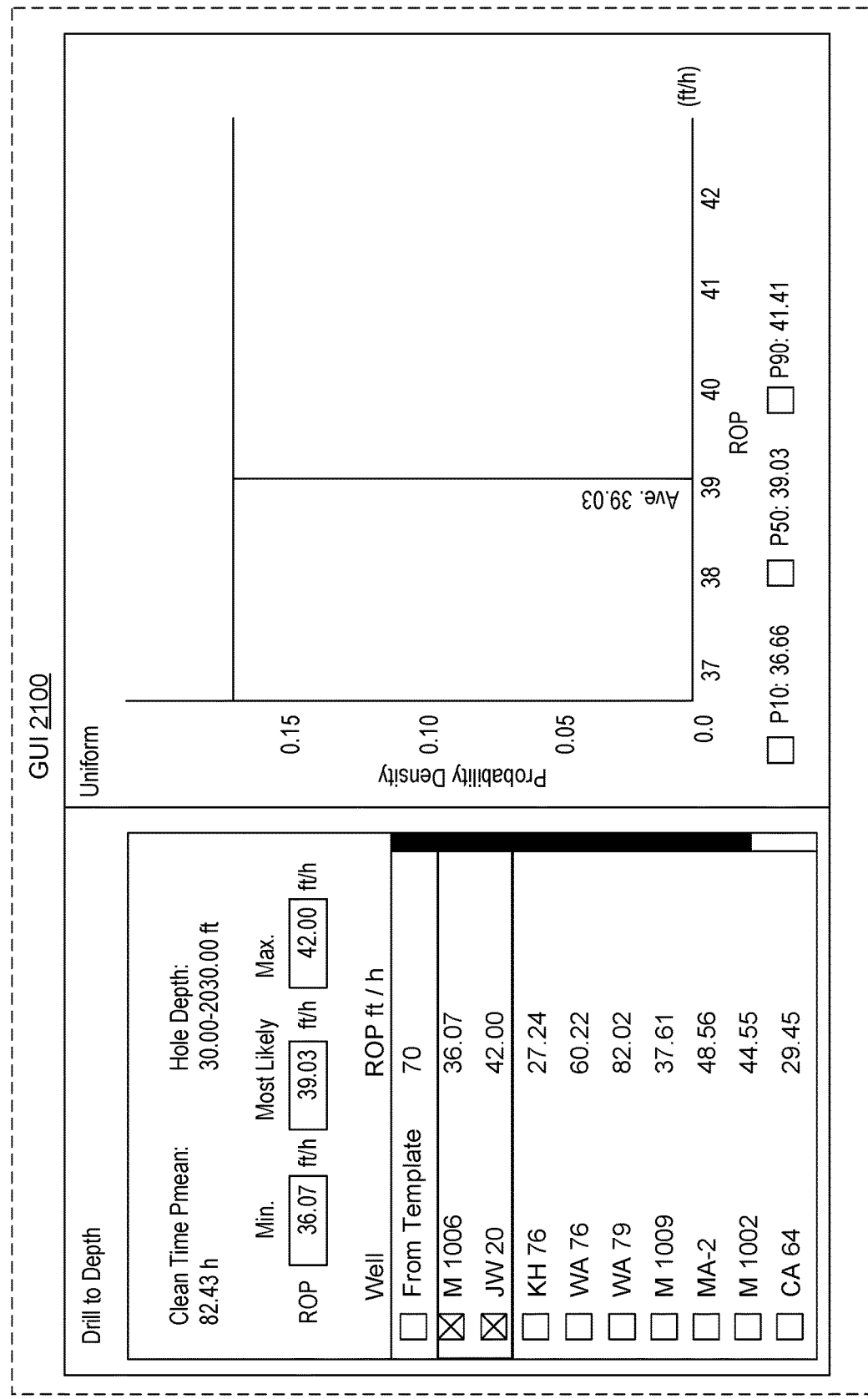
FIG. 21 illustrates an example of a graphical user interface.

FIG. 21 shows an example of a GUI 2100 with two selected wells and a uniform distribution. The distributions in the GUIs 1900, 2000 and 2100 may be compared to demonstrate how selected data can cause a method to determine a distribution where the type of distribution determined depends on an analysis of the selected data. In such an approach, as the selected data changes, the type of distribution may change.

FIG. 22 shows examples of GUIs 2210 and 2230, which may be accessible from a GUI such as one of the GUIs 1700, 1830, 1900, 2000, 2100, etc. For example, a settings icon may be rendered to a display as a graphical control that can be selected via a mouse or other pointing mechanism to cause one of the GUIs 2210 and 2230 to be rendered to the display. The GUIs 2210 and 2230 show radio buttons as graphical controls that are selectable, optionally in an exclusive manner. For example, one of two types of calculation methods may be selected exclusively. As shown, when the probabilistic radio button is selected, a sum of clean time and risk NPT can be utilized. In such an approach, simulation may be for one or more activities such as a pre-defined group or more. As to an output value, radio buttons are shown for Pmean (e.g., Pave or Ave.) and for a desired P value (e.g., P10, 20, 30, 40, 50, 60, 70, 80, 90 or other value). The GUI 2230 shows a selection of "deterministic", which causes rendering of a graphic for entry of a percentage of clean time for an approximation of NPT. As shown, an option can exist for utilizing a value in a template (see, e.g., "Use Template Value"). In such an approach, a user may make an estimate of time more or less conservative via NPT as a percentage of clean time.

Figure 23:
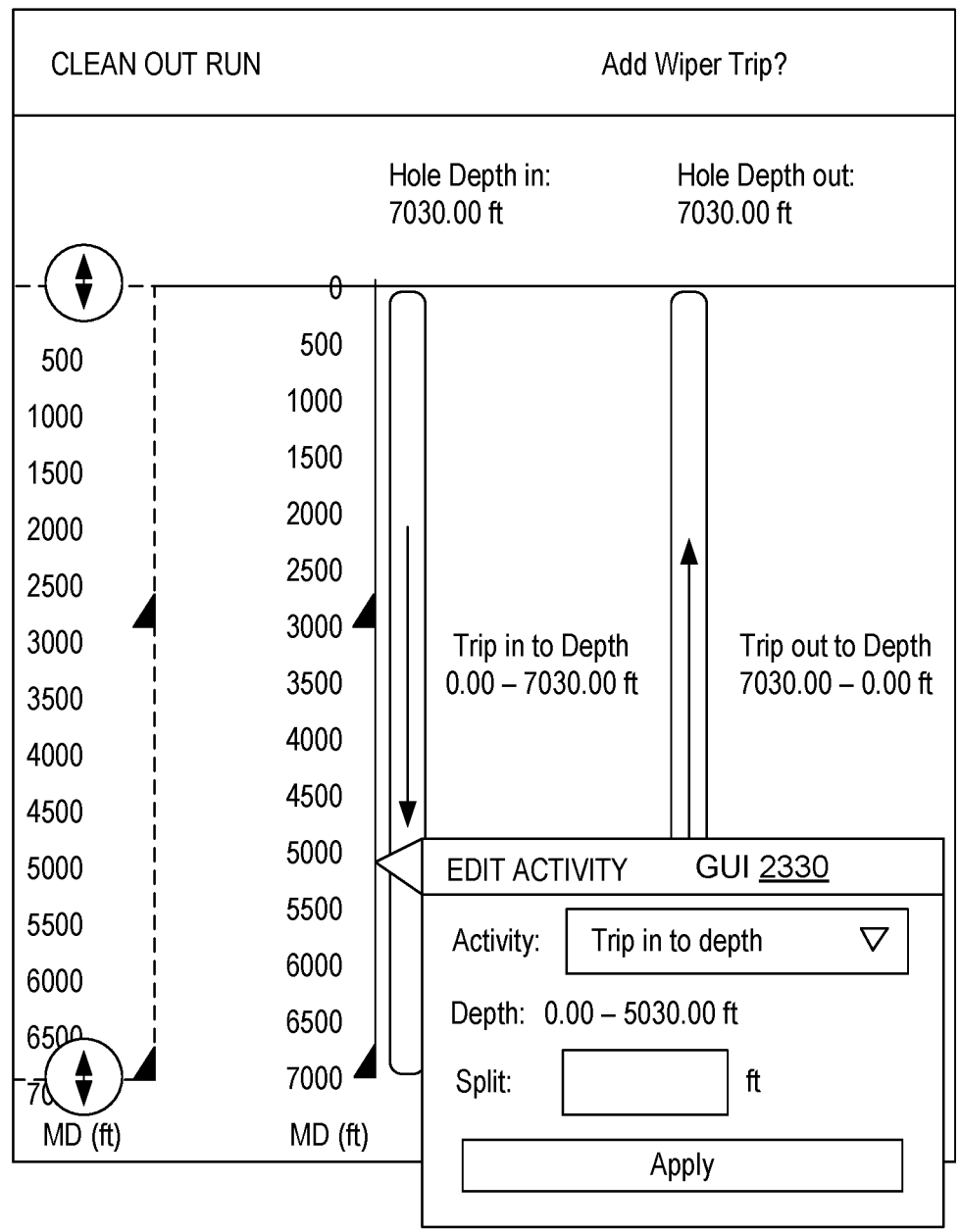
FIG. 23 illustrates examples of graphical user interfaces.

FIG. 23 shows an example of a GUI 2310 that pertains to an example activity such as a clean out run, which may be augmented, for example, with a wiper trip (e.g., a wiper run). The GUI 2310 includes graphics with respect to measured depth (MD) from surface to a MD of 7000 ft. Graphics are rendered for an in trip and an out trip. FIG. 23 also shows an example of a GUI 2330 that can be rendered in conjunction with the GUI 2310, for example, to perform one or more edits. For example, consider an edit to an activity (e.g., clean out run) that alters depth or that splits the depth into two or more depth segments. Such an approach may aim to cause a method to determine multiple distributions over portions of a well.

As an example, consider a well that includes a vertical portion, a build portion and a horizontal portion. In such an example, a user may edit an activity to match one or more of the portions and/or may split one or more of the portions. For example, consider splitting a horizontal portion into a perforated horizontal portion and an unperforated horizontal portion. In such an example, the perforated horizontal portion may be at a greater measured depth and have different dynamics than that of the unperforated horizontal portion, which may be at a lesser measured depth. Such an approach may help to segment data such that determined distributions for a horizontal portion account for such dynamics and hence more accurately represent times, rates, etc.

Figure 24:
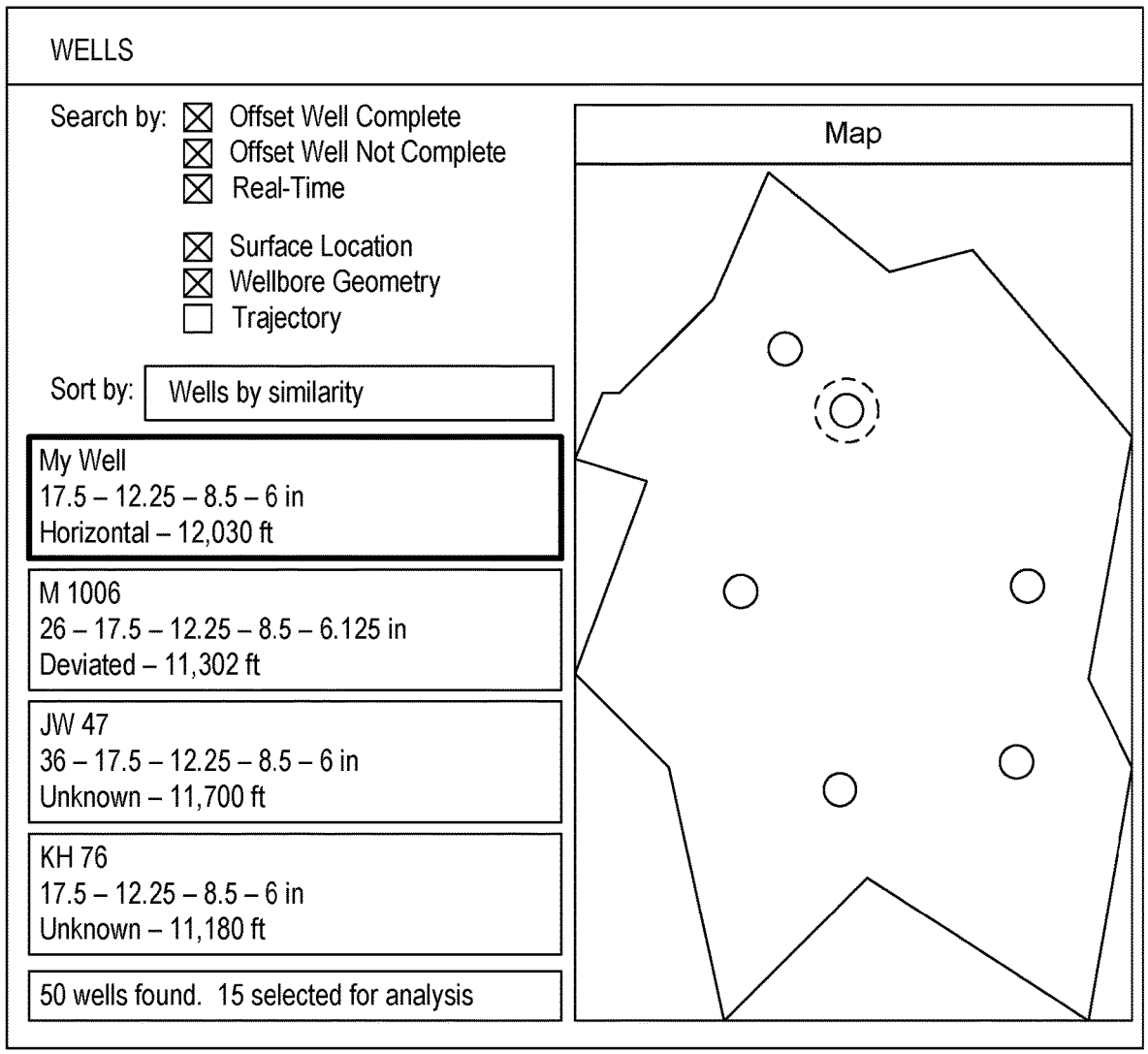
FIG. 24 illustrates an example of a graphical user interface.

FIG. 24 shows an example of a GUI 2400 that includes a search feature with various options along with a map panel, which may show search results using locations of wells. As shown in the example of FIG. 24, a search feature can include search by options such as search by offset well complete, not complete and/or real-time. As an example, a search feature can include search by surface location, wellbore geometry and/or trajectory. As an example, a sort feature can sort search results such as by similarity to a well, which may be a planned well (see, e.g., "My Well"). As an example, a well can be a well that is being constructed such that real-time data may be received, which may alter search results and/or ranking (e.g., sorting, etc.). As an example, a map may show wells by type. As an example, a well that is a real-time well that can provide real-time data may be rendered using colors and/or other features (e.g., blinking, etc.). As an example, when no data are being received, the well may be rendered to the map in a certain color. When data are being received, the well may be rendered to the map in a different color and/or, for example, using a blinking marker. Such an approach can allow a user to understand when results may be updated (e.g., revised) due to incoming real-time data.

Figure 25:
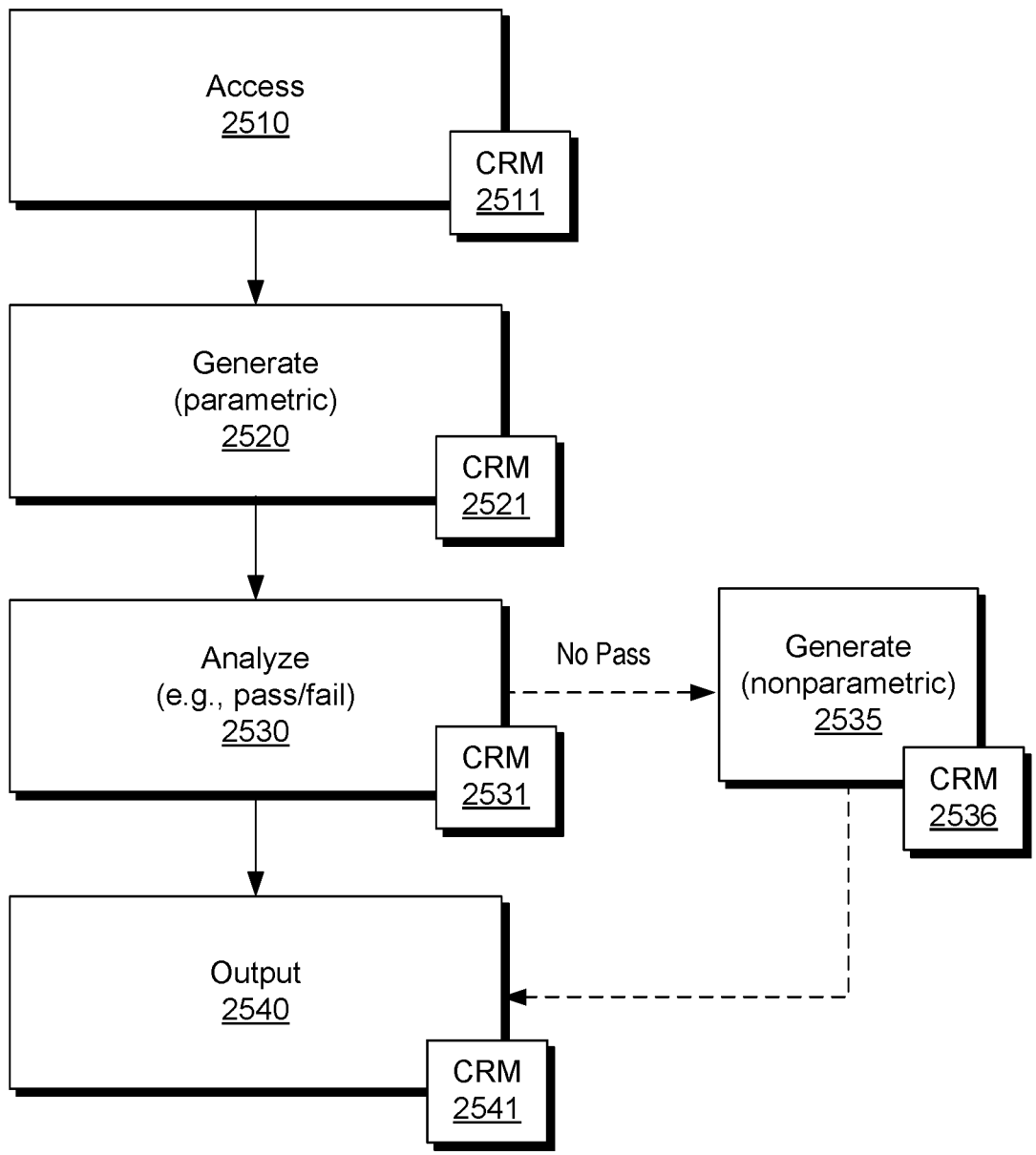
FIG. 25 illustrates an example of a method.

FIG. 25 shows an example of a method 2500 that includes an access block 2510 for accessing data associated with a well and one or more offset wells; a generation block 2520 for, based on at least a portion of the data, generating a set of distributions via parametric estimation, where the distributions are associated with a well-related activity and time; an analysis block 2530 for analyzing individual distributions in the set of distributions with respect to at least a portion of the data to pass or fail each of the individual distributions; and, an output block 2540, for one or more passed individual distributions, outputting one of the passed individual distributions for the well. FIG. 25 also includes a generation block 2535 that, for no passes, can generate a distribution, for example, nonparametrically (e.g., via nonparametric estimation).

As to the output block 2540, the well may be a well that is being planned, which may be referred to as "my well". Such a well can include various activities that are planned, which may be specific to that well. For example, the sections may be particular to that well, as to their depths, spans, etc. As shown in the GUI 2400 of FIG. 24, a well labeled "My Well" is utilized where particular data is shown (e.g., initial plan data, etc.). The search performed in the example of FIG. 24 indicates "similarity" such that ordering of results can be with respect to how similar the offset wells are to "My Well". A distribution that is output can be utilized to estimate a time for an activity associated with "My Well" (e.g., the distribution can be output for "My Well"). As explained, time estimates may be output for a plurality of activities. As mentioned, a user may select a probabilistic approach along with more than a single activity as part of a workflow for estimating a time or times for a well. As an example, the method 2500 may optionally be part of an interactive workflow that can output estimated time or times for a well as to one or more activities related to that well (see, e.g., the example activities of the GUI 1830 of FIG. 18). As an example, a method such as the method 2500 may operate in an automated manner where selection of a distribution occurs automatically. In such an example, a distribution may be assigned automatically to one or more activities. Such an approach can improve planning and/or execution of one or more activities.

The method 2500 is shown in FIG. 25 in association with various computer-readable media (CRM) blocks 2511, 2521, 2531, 2536, and 2541. Such blocks generally include instructions suitable for execution by one or more processors (or cores) to instruct a computing device or system to perform one or more actions. While various blocks are shown, a single medium may be configured with instructions to allow for, at least in part, performance of various actions of the method 2500. As an example, a CRM block can be a computer-readable storage medium that is non-transitory, not a carrier wave and not a signal. As an example, such blocks can include instructions that can be stored in memory and can be executable by one or more of processors.

Figure 26:
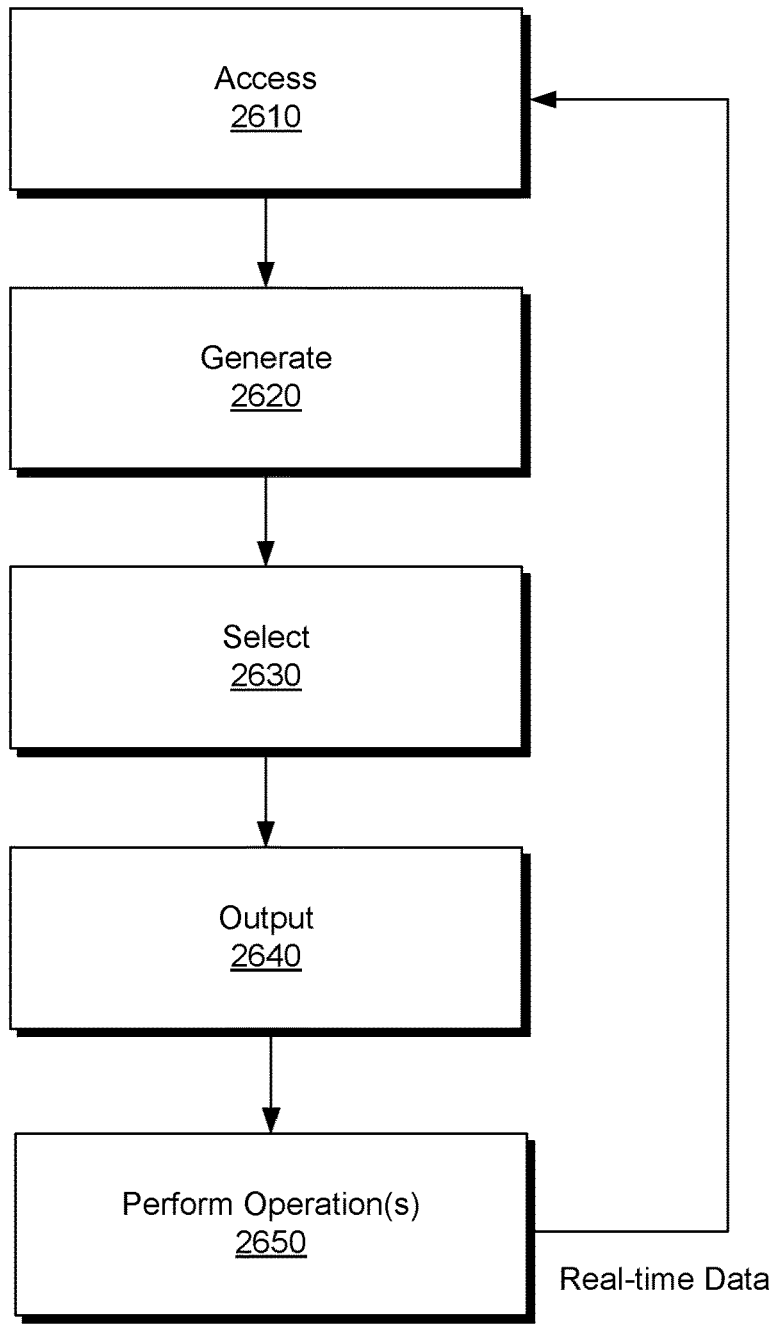
FIG. 26 illustrates an example of a method.

FIG. 26 shows an example of a method 2600 that includes an access block 2610 for accessing data associated with one or more wells that include a real-time well, a generation block 2620 for generating distributions using the data, a selection block 2630 for selecting one of the generated distributions, an output block 2640 for outputting the selected distribution, and a performance block 2650 for performing one or more activities in a field for constructing a well. As shown, real-time data associated with the well can be received by the access block 2610, which may cause generation of one or more different distributions (e.g., one or more revised distributions, etc.) by the generation block 2620. The selection block 2630 can then select an appropriate distribution such that the output block 2640 can output the selected distribution. In such an approach, one or more operations that are to be performed by the performance block 2650 may be revised with respect to time of performance using the output, selected distribution. For example, an estimated time to perform an activity may be revised such that a well plan (e.g., a digital well plan) is revised (see, e.g., the GUI 600 of FIG. 6). In such an approach, real-time data can be utilized to determine one or more distributions for one or more activities that can then be utilized to plan and/or alter one or more activities for one or more wells.

As an example, a well-related activity can be characterized by a rate, where the rate can be defined, for example, in distance divided by time. As an example, a distribution can be a distribution density with respect to time or a distribution density with respect to a rate.

As an example, a method can be performed for a plurality of well-related activities for outputting a plurality of different passed individual distributions for the well. In such an example, the method can include estimating a cumulative time for performing the plurality of well-related activities using the plurality of different passed individual distributions for the well.

As an example, a method can include accessing data associated with a well and one or more offset wells; based on at least a portion of the data, generating a set of distributions via parametric estimation, where the distributions are associated with a well-related activity and time; analyzing individual distributions in the set of distributions with respect to at least a portion of the data to pass or fail each of the individual distributions; and, for one or more passed individual distributions, outputting one of the passed individual distributions for the well. In such an example, the outputting can include selecting one of a plurality of passed individual distributions as a best fit to at least a portion of the data.

As an example, a method can include performing a well-related activity for a well. As an example, such a method can include revising a digital plan for the well based at least in part on a time for performing the well-related activity for the well.

As an example, where there are no passed individual distributions, based at least in part on a portion of data, a method can include generating a distribution via nonparametric estimation.

As an example, a well-related activity can be or include assembly of components of equipment and/or circulating fluid in a well. Various other well-related activities may be considered (e.g., drilling, logging, tripping, etc.).

A method can include generating a digital plan for construction of at least a portion of a well based at least in part on outputting a distribution.

As an example, a method can include generating a digital plan for construction of at least a portion of a well based at least in part on outputting a distribution.

As an example, parametric estimation can include maximum likelihood estimation that determines corresponding parameters of a distribution. For example, consider one or more of the following distributions: normal, lognormal, gamma, Weibull, uniform, triangle, and BetaPERT.

As an example, a method can include analyzing that includes hypothesis testing. For example, consider hypothesis testing that includes implementing a Kolmogorov-Smirnov test.

As an example, a method can include pre-processing at least a portion of data for one or more offset wells. In such an example, pre-processing can include identifying one or more outliers and removing at least one of the outliers from the data prior to generating the set of distributions.

As an example, a system can include a processor; memory accessible by the processor; processor-executable instructions stored in the memory and executable to instruct the system to: access data associated with a well and one or more offset wells; based on at least a portion of the data, generate a set of distributions via parametric estimation, where the distributions are associated with a well-related activity and time; analyze individual distributions in the set of distributions with respect to at least a portion of the data to pass or fail each of the individual distributions; and, for one or more passed individual distributions, output one of the passed individual distributions for the well.

As an example, one or more computer-readable storage media can include processor-executable instructions to instruct a computing system to: access data associated with a well and one or more offset wells; based on at least a portion of the data, generate a set of distributions via parametric estimation, where the distributions are associated with a well-related activity and time; analyze individual distributions in the set of distributions with respect to at least a portion of the data to pass or fail each of the individual distributions; and, for one or more passed individual distributions, output one of the passed individual distributions for the well.

As an example, a method may be implemented in part using computer-readable media (CRM), for example, as a module, a block, etc. that include information such as instructions suitable for execution by one or more processors (or processor cores) to instruct a computing device or system to perform one or more actions. As an example, a single medium may be configured with instructions to allow for, at least in part, performance of various actions of a method. As an example, a computer-readable medium (CRM) may be a computer-readable storage medium (e.g., a non-transitory medium) that is not a carrier wave.

According to an embodiment, one or more computer-readable media may include computer-executable instructions to instruct a computing system to output information for controlling a process. For example, such instructions may provide for output to sensing process, an injection process, drilling process, an extraction process, an extrusion process, a pumping process, a heating process, etc.

Figure 27:
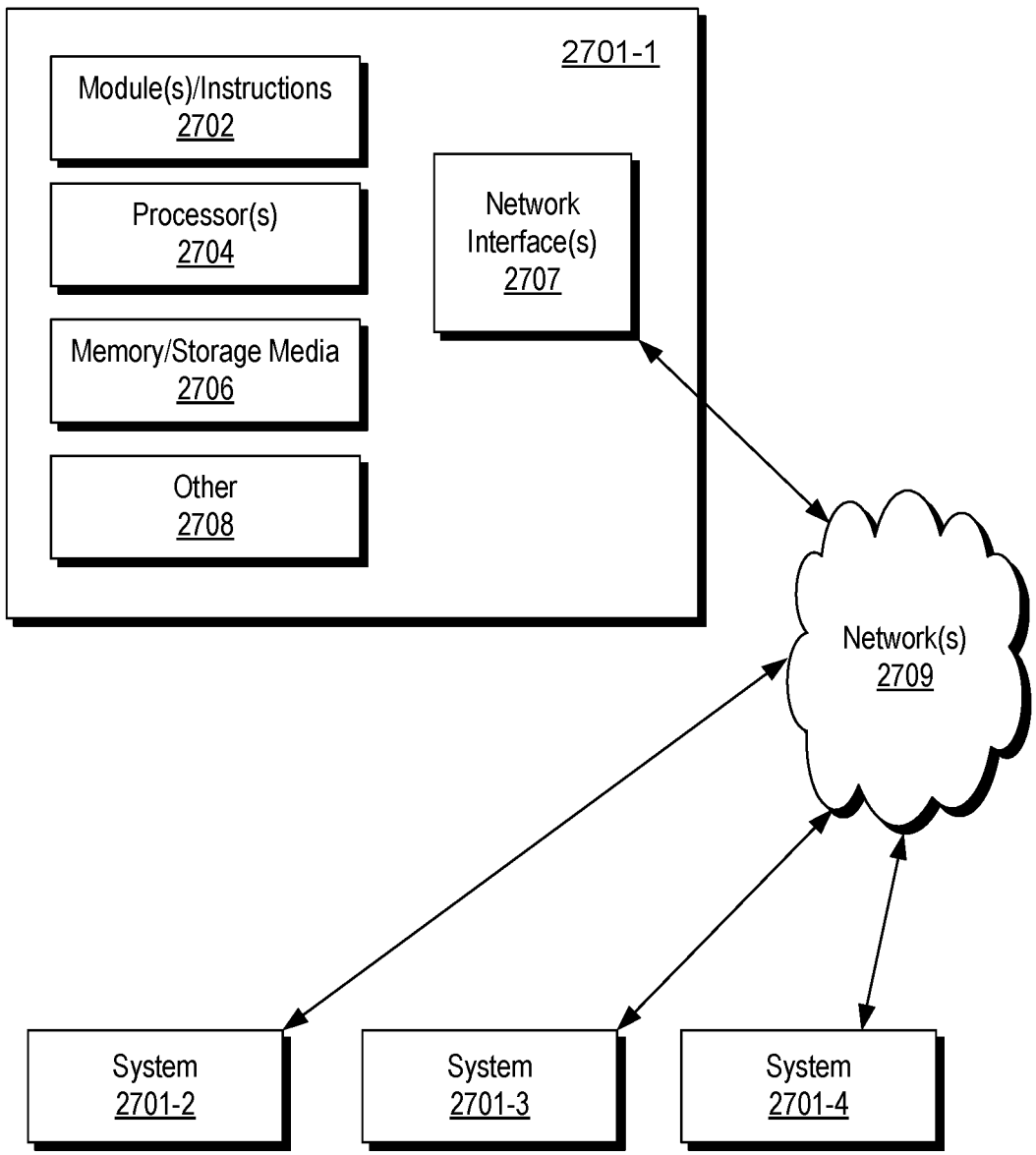
FIG. 27 illustrates an example of computing system.

In some embodiments, a method or methods may be executed by a computing system. FIG. 27 shows an example of a system 2700 that can include one or more computing systems 2701-1, 2701-2, 2701-3 and 2701-4, which may be operatively coupled via one or more networks 2709, which may include wired and/or wireless networks.

As an example, a system can include an individual computer system or an arrangement of distributed computer systems. In the example of FIG. 27, the computer system 2701-1 can include one or more modules 2702, which may be or include processor-executable instructions, for example, executable to perform various tasks (e.g., receiving information, requesting information, processing information, simulation, outputting information, etc.).

As an example, a module may be executed independently, or in coordination with, one or more processors 2704, which is (or are) operatively coupled to one or more storage media 2706 (e.g., via wire, wirelessly, etc.). As an example, one or more of the one or more processors 2704 can be operatively coupled to at least one of one or more network interface 2707. In such an example, the computer system 2701-1 can transmit and/or receive information, for example, via the one or more networks 2709 (e.g., consider one or more of the Internet, a private network, a cellular network, a satellite network, etc.).

As an example, the computer system 2701-1 may receive from and/or transmit information to one or more other devices, which may be or include, for example, one or more of the computer systems 2701-2, etc. A device may be located in a physical location that differs from that of the computer system 2701-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 2706 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 28:
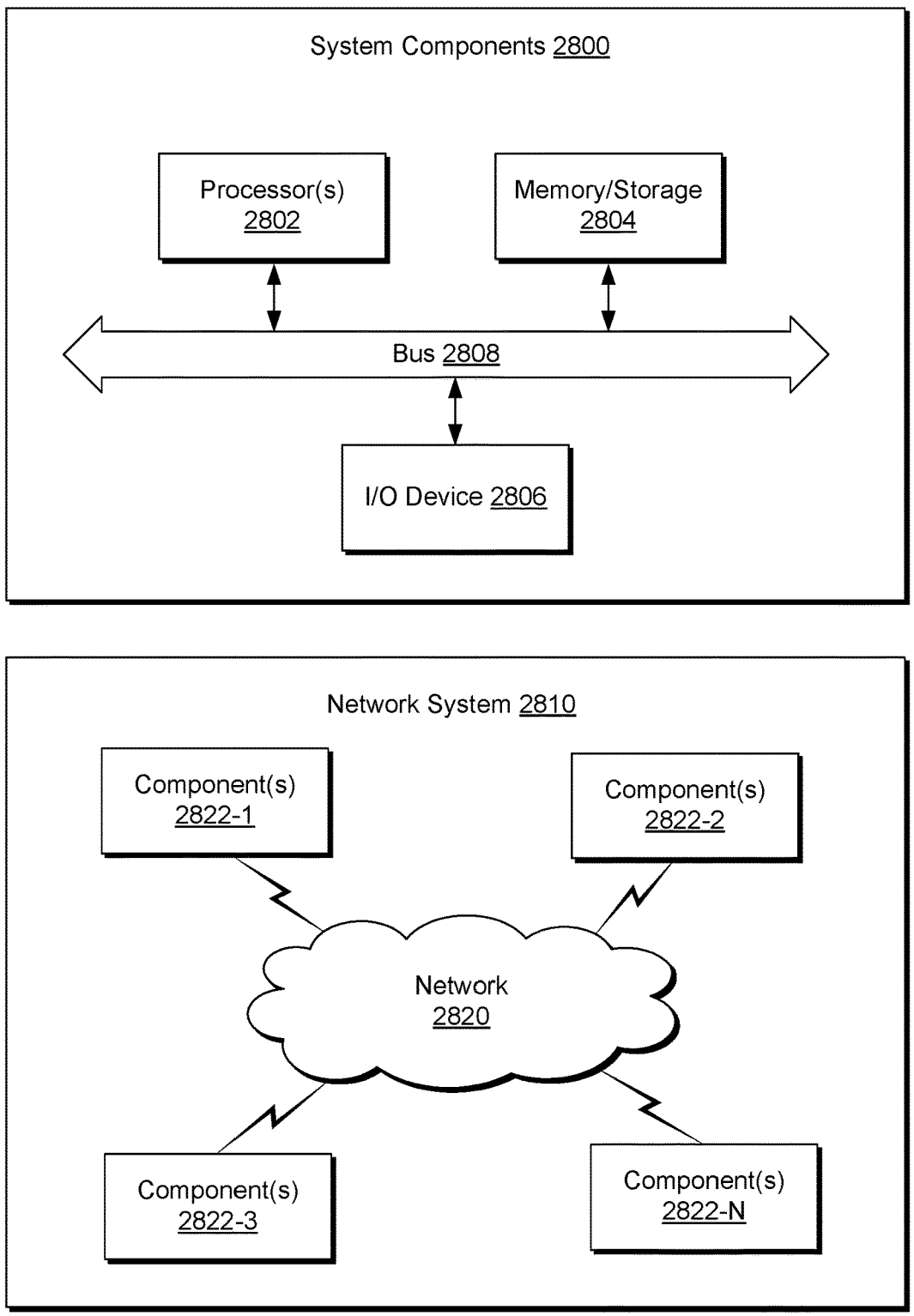
FIG. 28 illustrates example components of a system and a networked system.

FIG. 28 shows components of a computing system 2800 and a networked system 2810. The system 2800 includes one or more processors 2802, memory and/or storage components 2804, one or more input and/or output devices 2806 and a bus 2808. According to an embodiment, instructions may be stored in one or more computer-readable media (e.g., memory/storage components 2804). Such instructions may be read by one or more processors (e.g., the processor(s) 2802) via a communication bus (e.g., the bus 2808), which may be wired or wireless. The one or more processors may execute such instructions to implement (wholly or in part) one or more attributes (e.g., as part of a method). A user may view output from and interact with a process via an I/O device (e.g., the device 2806). According to an embodiment, a computer-readable medium may be a storage component such as a physical memory storage device, for example, a chip, a chip on a package, a memory card, etc.

According to an embodiment, components may be distributed, such as in the network system 2810. The network system 2810 includes components 2822-1, 2822-2, 2822-3, . . . 2822-N. For example, the components 2822-1 may include the processor(s) 2802 while the component(s) 2822-3 may include memory accessible by the processor(s) 2802. Further, the component(s) 2822-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
   accessing data associated with a well and one or more offset wells, wherein the data comprise data that correspond to multiple instances of performance of a well-related activity that utilizes a rig;
   based on at least a portion of the data, generating a set of distributions via parametric estimation that determines parameters for each distribution in the set of distributions, wherein the distributions are for the well-related activity and correspond to time to perform the well-related activity;
   via hypothesis testing, automatically analyzing individual distributions in the set of distributions with respect to at least a portion of the data to pass or fail each of the individual distributions;
   for one or more passed individual distributions, outputting one of the passed individual distributions for the well for estimating a time to perform the well-related activity at the well; and
   generating one or more graphical user interfaces that indicate the well-related activity for the well, the one of the passed individual distributions for the well and an estimated time for performance of the well-related activity based on the one of the passed individual distributions, and wherein the one or more graphical user interfaces indicate offset well information utilized to generate the one of the passed individual distributions.

2. The method of claim 1 wherein the outputting comprises automatically selecting one of a plurality of passed individual distributions as a best fit to at least a portion of the data.

3. The method of claim 1 comprising performing the well-related activity for the well.

4. The method of claim 3 comprising revising a digital plan for the well based at least in part on a time for performing the well-related activity for the well.

5. The method of claim 1 wherein the well-related activity is characterized by a rate, wherein the rate is defined in distance divided by time.

6. The method of claim 1 wherein each of the distributions comprises a distribution density with respect to time or a distribution density with respect to a rate.

7. The method of claim 1 comprising performing the method of claim 1 for a plurality of well-related activities and outputting a plurality of different passed individual distributions for the well.

8. The method of claim 7 comprising estimating a cumulative time for performing the plurality of well-related activities using the plurality of different passed individual distributions for the well.

9. The method of claim 1 wherein, for no passed individual distributions, based at least in part on a portion of the data, automatically generating a distribution via nonparametric estimation.

10. The method of claim 1 wherein the well-related activity comprises assembly components of equipment or comprises downhole activity.

11. The method of claim 1 comprising generating a digital plan for construction of at least a portion of the well based at least in part on the outputting.

12. The method of claim 1 wherein the parametric estimation comprises maximum likelihood estimation that determines corresponding parameters of at least one distribution in the set of distributions.

13. The method of claim 1 wherein the set of distributions comprises at least one member selected from a group that comprises normal, lognormal, gamma, Weibull, uniform, triangle, and BetaPERT.

14. The method of claim 1 wherein the hypothesis testing comprises implementing a Kolmogorov-Smirnov test.

15. The method of claim 1 comprising pre-processing at least a portion of the data.

16. The method of claim 15 wherein the pre-processing comprises identifying one or more outliers and removing at least one of the outliers from the data prior to generating the set of distributions.

17. The method of claim 1, comprising, based at least in part on the one of the passed individual distributions for the well, simulating a total well time estimation for constructing at least a portion of the well.

18. The method of claim 17, wherein the simulating predicts a confidence interval for the total well time estimation.

19. A system comprising:
   a processor;
   memory accessible by the processor;
   processor-executable instructions stored in the memory and executable to instruct the system to:
      access data associated with a well and one or more offset wells, wherein the data comprise data that correspond to multiple instances of performance of a well-related activity that utilizes a rig;
      based on at least a portion of the data, generate a set of distributions via parametric estimation that determines parameters for each distribution in the set of distributions, wherein the distributions are for the well-related activity and correspond to time to perform the well-related activity;
      via hypothesis testing, automatically analyze individual distributions in the set of distributions with respect to at least a portion of the data to pass or fail each of the individual distributions;
      for one or more passed individual distributions, output one of the passed individual distributions for the well for estimating a time to perform the well-related activity at the well; and
      generate one or more graphical user interfaces that indicate the well-related activity for the well, the one of the passed individual distributions for the well and an estimated time for performance of the well-related activity based on the one of the passed individual distributions, and wherein the one or more graphical user interfaces indicate offset well information utilized to generate the one of the passed individual distributions.

20. One or more non-transitory computer-readable storage media comprising processor-executable instructions to instruct a computing system to:
- access data associated with a well and one or more offset wells, wherein the data comprise data that correspond to multiple instances of performance of a well-related activity that utilizes a rig;
- based on at least a portion of the data, generate a set of distributions via parametric estimation that determines parameters for each distribution in the set of distributions, wherein the distributions are for the well-related activity and correspond to time to perform the well-related activity;
- via hypothesis testing, automatically analyze individual distributions in the set of distributions with respect to at least a portion of the data to pass or fail each of the individual distributions; and
- for one or more passed individual distributions, output one of the passed individual distributions for the well for estimating a time to perform the well-related activity at the well; and
- generate one or more graphical user interfaces that indicate the well-related activity for the well, the one of the passed individual distributions for the well and an estimated time for performance of the well-related activity based on the one of the passed individual distributions, and wherein the one or more graphical user interfaces indicate offset well information utilized to generate the one of the passed individual distributions.

* * * * *